(12) United States Patent
Tsuchiaki

(10) Patent No.: US 7,786,538 B2
(45) Date of Patent: Aug. 31, 2010

(54) SEMICONDUCTOR DEVICE HAVING A NICKEL SILICIDE LAYER ON A SINGLE CRYSTAL SILICON LAYER

(75) Inventor: Masakatsu Tsuchiaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 12/146,620

(22) Filed: Jun. 26, 2008

(65) Prior Publication Data

US 2009/0065877 A1 Mar. 12, 2009

(30) Foreign Application Priority Data

Sep. 12, 2007 (JP) ............................. 2007-236710

(51) Int. Cl.
*H01L 21/00* (2006.01)
*H01L 31/062* (2006.01)
*H01L 31/113* (2006.01)
H01L 21/336 (2006.01)
H01L 21/3205 (2006.01)
H01L 21/4763 (2006.01)

(52) U.S. Cl. .................. 257/384; 257/382; 257/392; 438/300; 438/304; 438/596

(58) Field of Classification Search .............. 257/382, 257/384, 392; 438/300
See application file for complete search history.

(56) References Cited

U.S. PATENT DOCUMENTS 6,271,566 B1 8/2001 Tsuchiaki

2003/0205774 A1* 11/2003 Hokazono ................. 257/486
2004/0183146 A1* 9/2004 Hokazono et al. ........... 257/412
2006/0128105 A1* 6/2006 Ouyang et al. ............. 438/300
2006/0138398 A1* 6/2006 Shimamune et al. ......... 257/19

(Continued)

OTHER PUBLICATIONS

Tsuchiaki et al.; "Junction Leakage Generation by NiSi Thermal Instability Characterized Using Damage-Free n+/p Silicon Doides"; Japanese Journal of Applied Physics, vol. 43, No. 8A, pp. 5166-5173, (2004).

(Continued)

*Primary Examiner*—N Drew Richards
*Assistant Examiner*—Michael Jung
(74) *Attorney, Agent, or Firm*—Finnegan, Henderson, Farabow, Garrett & Dunner, L.L.P.

(57) ABSTRACT

A semiconductor device includes: a first MOSFET including: first source and drain regions formed at a distance from each other in a first semiconductor region; a first insulating film formed on the first semiconductor region between the first source region and the first drain region; a first gate electrode formed on the first insulating film; a first sidewall insulating film formed at side portions of the first gate electrode; a first single-crystal silicon layer formed on each of the first source and drain regions, and having at least an upper-face made of a $\{111\}$ plane; a first NiSi layer formed at least on the first single-crystal silicon layer, and having a portion whose interface with the first single-crystal silicon is on the $\{111\}$ plane of the first single-crystal silicon layer and a part of the portion of the first NiSi layer being in contact with the first sidewall insulating film; and a first TiN film being in contact with the portion of the first NiSi layer on the $\{111\}$ plane of the first single-crystal silicon.

12 Claims, 29 Drawing Sheets

U.S. PATENT DOCUMENTS

2007/0042544 A1* 2/2007 Wu et al. .................... 438/257
2008/0003755 A1* 1/2008 Shah et al. .................. 438/300
2009/0001420 A1* 1/2009 Matsumoto ................ 257/190

OTHER PUBLICATIONS

Sung at al. ; "High Performance CMOS Bulk Technology Using Direct Silicon Bond (DSB) Mixed Crystal Orientation Substrates"; IEDM Tech. Dig., pp. 235-238, (2005).

Huang et al.; "Sub-50 nm P-Channel FinFET"; IEEE Transactions on Electron Devices, vol. 48, No. 5, pp. 880-886, (2001).

Wang et al., "High-Performance PMOS Devices on (110)/<111'> Substrate/Channel with Multiple Stressors," IEEE (2006), pp. 67-70.

Irie et al., "In-Plane Mobility Anisotropy and Universality Under Uni-axial Strains in n- and p-MOS Inversion Layers on (100), (110), and (111) Si," IEEE (2004), pp. 225-228.

Shoji et al., "Electronic structures and phonon-limited electron mobility of double-gate silicon-on-insulator Si inversion layers," Journal of Applied Physics, vol. 85, No. 5 (Mar. 1, 1999), pp. 2722-2731.

* cited by examiner

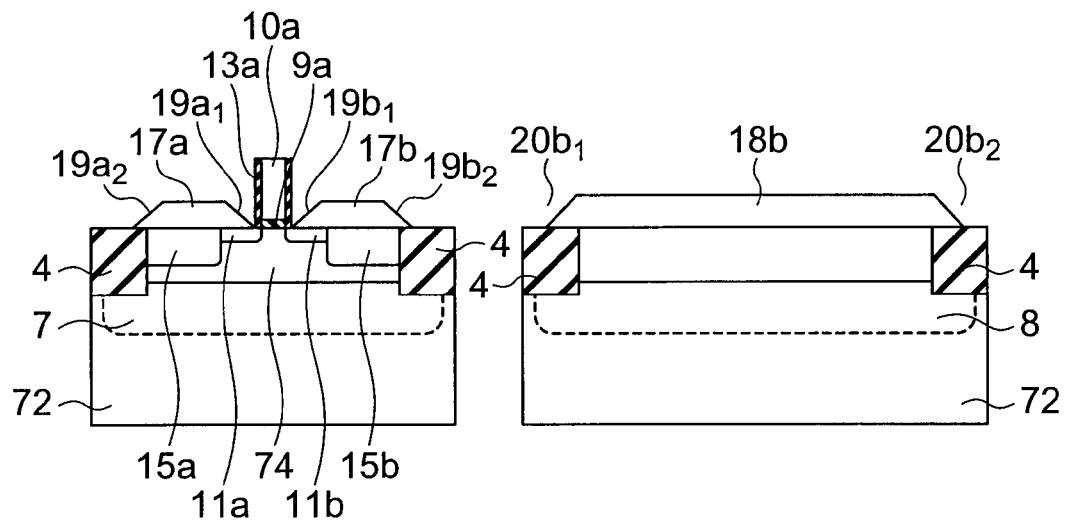
A-A SECTION
FIG. 37A
B-B SECTION
FIG. 37B
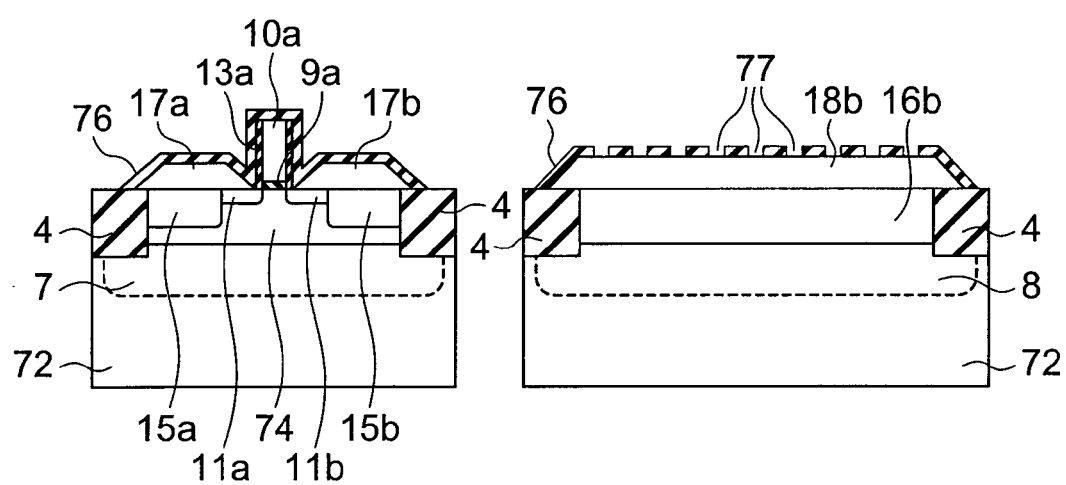
A-A SECTION
FIG. 38A
B-B SECTION
FIG. 38B

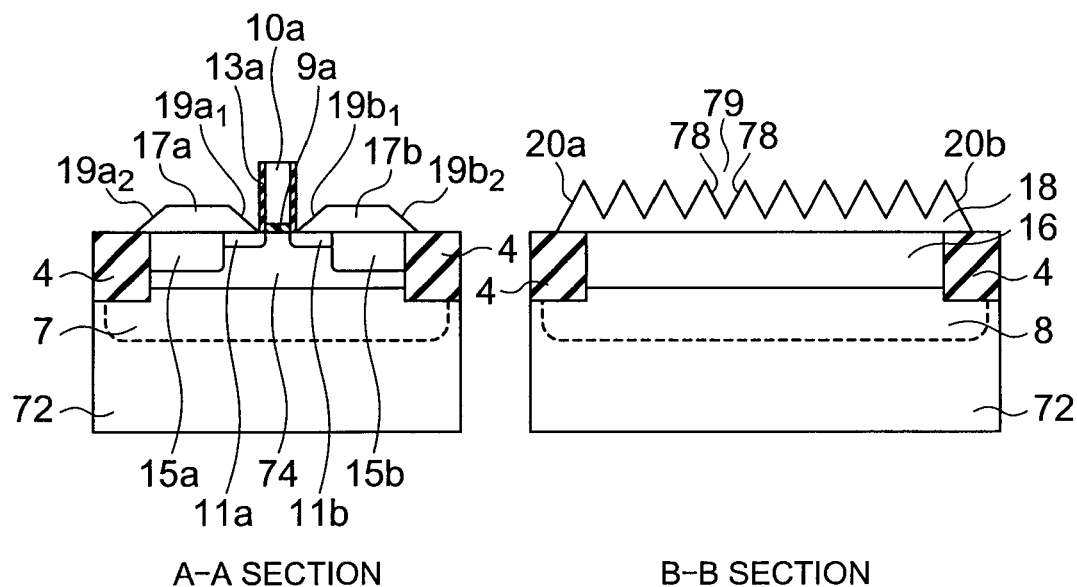
A-A SECTION
FIG. 39A
B-B SECTION
FIG. 39B
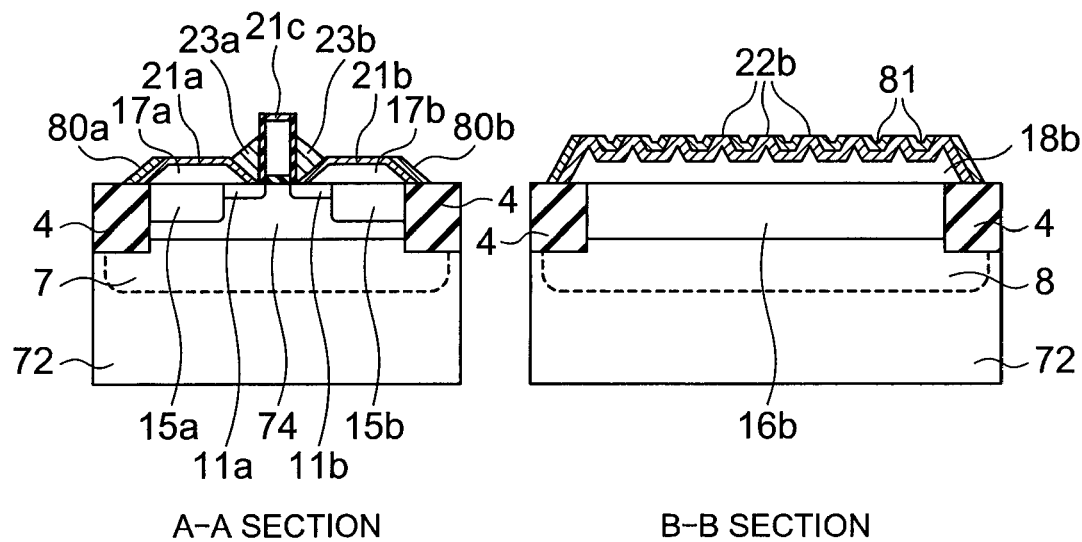
A-A SECTION
FIG. 40A
B-B SECTION
FIG. 40B

SEMICONDUCTOR DEVICE HAVING A NICKEL SILICIDE LAYER ON A SINGLE CRYSTAL SILICON LAYER

CROSS-REFERENCE TO RELATED APPLICATION

This application is base upon and claims the benefit of priority for prior Japanese Patent Application No. 2007-236710 filed on Sep. 12, 2007 in Japan, which is incorporated herein by reference.

BACKGROUND OF THE INVENTION

1. Field of the Invention

The present invention relates to a semiconductor device having MOSFETs and a method for manufacturing the semiconductor device.

2. Related Art

The advent of ultrahigh-speed and high-functionality semiconductor devices had spurred rapid evolution of an information-oriented and knowledge-intensive society into a global web of high-speed communication networks, as exemplified by the ubiquitous presence of radiofrequency cellular or "mobile" phones in daily lives. Naturally, the world-wide spread of such social transformation, as well as an insatiable quest for more efficient and convenient life-styles, demands yet higher-speed operation of ever-shrinking semiconductor devices being integrated on a much larger scale, to realize a system-on-chip versatile architecture which provides almost every conceivable functionality.

As a matter of course, to meet the above demand, the physical dimensions of principal components of a large scale integration (LSI) circuit, i.e., metal insulator semiconductor field effect transistors (MISFET's), or more specifically, metal oxide semiconductor field effect transistors (MOSFET's), have to be reduced accordingly.

Unfortunately, however, further miniaturizing the MOSFET dimensions while speeding-up its operation becomes increasingly a difficult task to achieve. In fact, as explained below, various technical difficulties arise from this attempt.

One of such difficulties arises from sharp decrease of threshold voltage with the downscaling or shrinkage of the channel length of the MOSFET (i.e., reduction of the physical length of the gate electrode), widely known as the short channel effect. When the threshold voltage comes to depend on the physical gate length, even a slight process variation during the gate electrode formation results in uncontrollable deviation in the threshold voltage. Of course, a MOSFET with an unintended threshold voltage, when it is very different from the designed value, gives rise to erratic device operations which is incompatible with the original intention of the device and may well totally impair the proper functionality of the entire circuit.

Obviously, in order to obtain a large number of coherent and identical MOSFETs, the short-channel-effect-induced strong dependence of the threshold voltage on the physical gate length is extremely detrimental. The resultant intolerance of even a minute process deviation during the device fabrication makes it very difficult to manufacture efficiently an electric circuit composed of a great number of uniform and densely-packed elements, such as a dynamic random access memory (DRAM).

In view of its physical mechanism, this short channel effect is a result of distortion of an electric potential near the central portion of the channel region induced by electric fields at source/drain (S/D) electrodes. As the channel length decreases, the influence of S/D electric fields comes to reach the central portion of the channel, allowing premature channel currents to flow between S/D electrodes even when the gate voltage is below the intended value (i.e., reducing the threshold voltage).

As widely recognized, by making the p-n junctions that forms S/D regions (i.e., S/D p-n junctions) shallower, the short channel effect can be avoided. However, simply making the S/D p-n junctions very shallow inevitably results in unacceptable increase in the electrical resistances of the S/D electrodes. The resistance increase impedes high-speed transmission of electrical signals through the MOSFET, thereby, totally dashing the original intention of miniaturizing the MOSFET dimensions to speed-up its operation.

One of the best ways of reducing the S/D electrode resistance is silicidation (i.e., compound formation between silicon and metal substance) of upper parts of S/D p-n junctions. The metal species that could be used for this purpose includes cobalt (Co), titanium (Ti) and nickel (Ni). However, of these metals, Ni is the primary choice for the silicidation of fine structures employed by today's ULSI technology. This is because it is free from adverse line-width effects (i.e., resistivity increase of silicide layers when they are formed on narrow lines).

In addition, the silicidation reaction between Si and Ni can be completed at a temperature as low as 450° C., which is much lower than the $CoSi_2$ formation temperature (i.e., 800° C.). Moreover, this low temperature thermal treatment produces a layer of NiSi, which has a very low resistivity. Applying thermal processing at a higher temperature of about 750° C. causes an unfavorable phase transition of the NiSi layer into a layer of $NiSi_2$, that has a higher electrical resistivity than that of NiSi. Thus, naturally, it is this NiSi layer of low resistance that is typically used for ULSI devices.

Unfortunately, however, NiSi is not a problem-free option. In fact, its thermal stability is the greatest concern of the NiSi technology. In general, after having formed the low-resistance NiSi layer, it is indispensable to perform thermal processing at 500° C. for about 90 minutes, for example, in order to establish good electrical contact between the NiSi layer and a metal substance formed thereon. However, even this moderate thermal processing (i.e., at 500° C. for 90 min) is found to trigger a substantial burst of Ni atoms from the NiSi layer deep into the Si substrate, even reaching a depth of about 140 nm, though it is done at a temperature well below the phase transition temperature (as disclosed by M. Tsuchiaki, Jpn. J. Appl. Phys., Vol. 43, p. 5166 (2004), for example).

Of course, the Ni atoms that infiltrated deeply into the Si substrate form gap states in the forbidden band of Si, thereby assisting or promoting leakage generation. Since this Ni burst into the Si substrate is an intrinsic characteristic of NiSi, it proceeds unavoidably whenever NiSi and Si are in physical contact at an elevated temperature. Obviously, once such gap states are formed at the S/D junctions, substantial leakage currents flow through the junctions into the Si substrate, and eventually, an intended functionality of the device will be completely lost (e.g., loss of data memorized in DRAM cells).

In order to solve the aforementioned problems, an elevated source drain method has been commonly utilized. In this method, semiconductor layers are selectively formed (for example, silicon is grown) on surface portions of a semiconductor substrate where source and drain electrodes are to be formed. Because the surfaces of this additionally formed semiconductor layers are higher than the original semiconductor surface (i.e., the surface where a channel is to be formed), pn junction depths of the source and drain regions are shallow relative to the original semiconductor surface, but deep relative to the newly formed surfaces, securing the enough depth of the electrode while suppressing the short channel effects. Such a selective silicon growth can be achieved by using an epitaxial growth method.

Unfortunately, however, the thickness of the selectively grown silicon layer tends to decrease when it nears the gate electrode. Accordingly, the shortest distance between the additional surface (where the metal is to be deposited) and the junction depth is predetermined at this portion adjacent to the gate electrode. Thus, no matter how thick the selectively grown silicon layer is made at the other portions, its ability to block the leakage generation is not enhanced.

As described above, shrinkage of the MOSFET's dimensions requires commensurate shallowing of the source and drain junctions. At the same time, to secure high speed operation, silicidation of the source and drain regions is necessary.

However, for silicidation of shallow junctions (e.g., source/drain extension regions next to the gate electrode), the high-speed diffusion of metal atoms from the silicide causes substantial junction leakage current. The leakage is so devastating that metal compound formation on the source/drain extension regions is practically prohibited.

Without silicidation, however, the electric resistance around the source/drain extension regions becomes very high, causing a large potential drop at these portions. Since voltages applied to the source/drain electrodes are largely wasted, they cannot induce sufficient channel currents. Obviously, a MOSFET with high-speed operation cannot be obtained without silicidation of the source/drain extension regions.

Therefore, to prevent generation of junction leakage current due to silicidation of the shallow source/drain extension regions, it is necessary to develop a new method for suppressing infiltration of metallic atoms from the silicide layer into the substrate in the region adjacent to the gate electrode.

SUMMARY OF THE INVENTION

The present invention has been made in view of these circumstances, and an objective thereof is to provide a semiconductor device and a method for manufacturing the semiconductor device without silicidation-induced current leakage.

A semiconductor device according to a first aspect of the present invention includes: a silicon substrate including a first semiconductor region of a first conductivity type; and a first MOSFET including: first source and drain regions of a second conductivity type formed at a distance from each other in the first semiconductor region; a first insulating film formed on a portion of the first semiconductor region, the portion being located between the first source region and the first drain region; a first gate electrode formed on the first insulating film; a first sidewall insulating film formed at side portions of the first gate electrode; a first single-crystal silicon layer formed on each of the first source and drain regions, and having at least an upper-face made of a {111} planes; a first NiSi layer formed at least on the first single-crystal silicon layer, and having a portion whose interface with the first single-crystal silicon layer is on a {111} plane of the first single-crystal silicon layer and a part of the portion of the first NiSi layer being in contact with the first sidewall insulating film; and a first TiN film being in contact with the portion of the first NiSi layer on the {111} plane of the first single-crystal silicon layer.

A semiconductor device according to a second aspect of the present invention includes: a silicon substrate including a first semiconductor region of a first conductivity type; and a first MOSFET including: first source and drain regions of a second conductivity type formed at a distance from each other in the first semiconductor region; a first insulating film formed on a portion of the first semiconductor region, the portion being located between the first source region and the first drain region; a first gate electrode formed on the first insulating film; a first sidewall insulating film formed at side portions of the first gate electrode; a first single-crystal silicon layer formed on each of the first source and drain regions, and having a plurality of first grooves that reach the first source and drain regions, each sidewall of the first grooves being made of a {111} plane; a first NiSi layer formed at least on the {111} sidewalls of first grooves in the first single-crystal silicon layer; and a first TiN film being in contact with the first NiSi layer on the {111} sidewalls.

A semiconductor device according to a third aspect of the present invention includes: a silicon substrate including a first semiconductor region of a first conductivity type; and a first MOSFET including: first source and drain regions of a second conductivity type formed at a distance from each other in the first semiconductor region; a first insulating film formed on a portion of the first semiconductor region, the portion being located between the first source region and the first drain region; a first gate electrode formed on the first insulating film; a first sidewall insulating film formed at side portions of the first gate electrode; a first single-crystal silicon layer formed on each of the first source and drain regions; a first NiSi layer formed on the first single-crystal silicon layer, an interface between the first single-crystal silicon layer and the first NiSi layer being on {111} planes of the first single-crystal silicon layer; and a first TiN film being in contact with the first NiSi layer.

A semiconductor device according to a fourth aspect of the present invention includes: a channel region formed into a wall-like plate-shaped single-crystal silicon layer on an insulating film, whose shape is defined by a pair of first opposing side planes and a pair of second opposing side planes; a source region formed on the insulating film, whose shape is defined by a pair of third opposing side planes and a pair of forth opposing side planes; the third side planes being Si{111} planes and one of the forth opposing side planes being connected to one of the first opposing side planes of the channel region; a drain region formed on the insulating film, whose shape is defined by a pair of fifth opposing side planes and a pair of sixth opposing side planes; the fifth opposing side planes being Si{111} planes and one of the sixth opposing side planes being connected to the other side plane of the first opposing side planes of the channel region; a pair of gate insulating films on a pair of second opposing side planes of the channel region; a gate electrode straddling over a pair of second opposing side planes of the channel region via the pair of insulating films; a NiSi layer formed on each Si{111} face of the source and drain regions; and a TiN film being in contact with the NiSi layer.

A method for manufacturing a semiconductor device according to a fifth aspect of the present invention includes: forming a gate insulating film on a silicon substrate; forming a gate electrode on the gate insulating film; forming source and drain regions on the silicon substrate, with the gate electrode being used as a mask; additionally forming a silicon layer selectively on the source and drain regions, whose surfaces are Si{111} at both sides of the gate; forming a NiSi layer at lease on the Si{111} planes; and forming a TiN film on the NiSi layer on the Si{111} planes.

A method for manufacturing a semiconductor device according to a sixth aspect of the present invention includes:

forming a gate insulating film on a silicon substrate; forming a gate electrode on the gate insulating film; forming source and drain regions on the silicon substrate, with the gate electrode being used as a mask; depositing a silicon layer on the source and drain regions; forming a first carbon-containing silicon layer on a horizontal surface of the silicon layer; thermally oxidizing the silicon layer; removing the first carbon-containing silicon layer; forming a plurality of grooves in the silicon layer, whose sidewalls are made of Si{111} planes; forming a NiSi layer on each sidewall of the grooves; and forming a TiN film over the NiSi layer on each sidewall of the grooves.

BRIEF DESCRIPTION OF THE DRAWINGS

FIGS. 37A to 40B are cross-sectional views showing the procedures for manufacturing a semiconductor device according to the third embodiment;

DETAILED DESCRIPTION OF THE INVENTION

Figure 1:
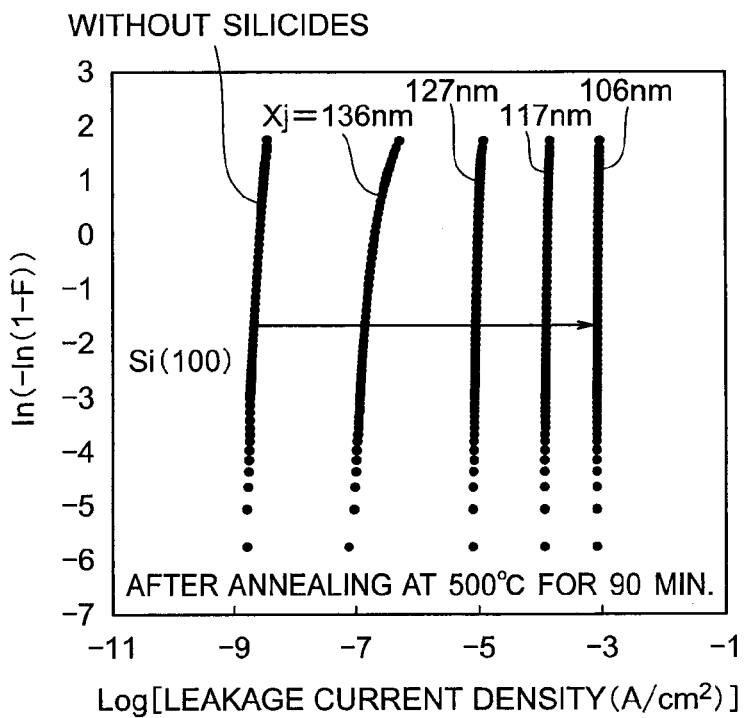
FIG. 1 is a Weibull plot of areal leakage levels over 312 large junctions (i.e., 1×1 mm² square junctions) at various depths for Si(100) substrates.

It has been found by the present inventor that even a moderate thermal processing at 500° C. for 90 min can generate substantial leakage through junctions, even though the junction depths are much deeper than the silicide film. Nonetheless, the post-silicide annealing is indispensable to secure good electrical contact between the NiSi layer and a metal substance thereon via a very small opening (i.e., contact hole).

It should be also noted that this leakage is generated during annealing at a temperature well below the phase transition temperature from NiSi to $NiSi_2$—i.e., 750° C.

Furthermore, from an in-depth research to elucidate influences of the substrate crystal orientation on the thermal stability of the NiSi films, the present inventor has also found that the thermally-induced junction leakage can be suppressed totally by appropriately forming the NiSi films on a specific crystal plane of silicon when a particular film is further stacked over the NiSi films.

In the following, this crucial discovery to the present invention will be explained in detail, with reference to some of the accompanying figures and the drawing.

First, several cautions should be made on the terminology to be used hereafter. A crystallographically equivalent plane to a (abc) plane will be expressed by {abc}—for example, a {100} plane for a (100) plane, {110} for (110), and {111} for (111). A surface parallel to a {abc} plane may be denoted by a {abc} surface for short. In addition, a crystal direction that is equivalent crystallographically to a [xyz] direction is represented by a <xyz> direction; for example, a <100> direction for [100], and <110> for [110].

[Substrate Orientation Dependence of Junction Leakage Current]

In order to investigate the leakage currents from the NiSi films, p/n junctions with various depths were fabricated on Si substrates having a {100} plane, a {110} plane, and a {111} plane as principal surfaces (to be denoted as Si(100), Si(110), Si(110) substrates, for short, respectively). Sputter-deposition of a nickel (Ni) film and ensuing rapid thermal annealing (RTA) in a nitrogen gas at 450° C. prompted 30 nm-thick nickel silicide (NiSi) formation over the junctions. After completion of the silicide layers, these silicided junctions were further annealed at 500° C. for 90 min in $N_2$, to gauge impacts of the heat stimulus. The temperature ramping/quenching rates were set to be 100° C. per minute. After this post-silicide annealing, leakage currents through the junctions of various depths, $x_j$, were carefully measured.

FIG. 1 shows a Weibull plot of areal leakage levels over 312 large junctions (i.e., 1×1 mm² square junctions) at various depths for Si(100) substrates. For reference, the data observed without NiSi layers (No Silicide) is also shown.

In this plot, the leakage levels are expressed in logarithmic scale in the abscissa. The ordinate axis indicates $\ln(-\ln(1-F))$, where, "F" represents the fraction of junctions with leakage levels equal to or smaller than the corresponding value of the abscissa and "ln" is the natural logarithm.

Figure 2:
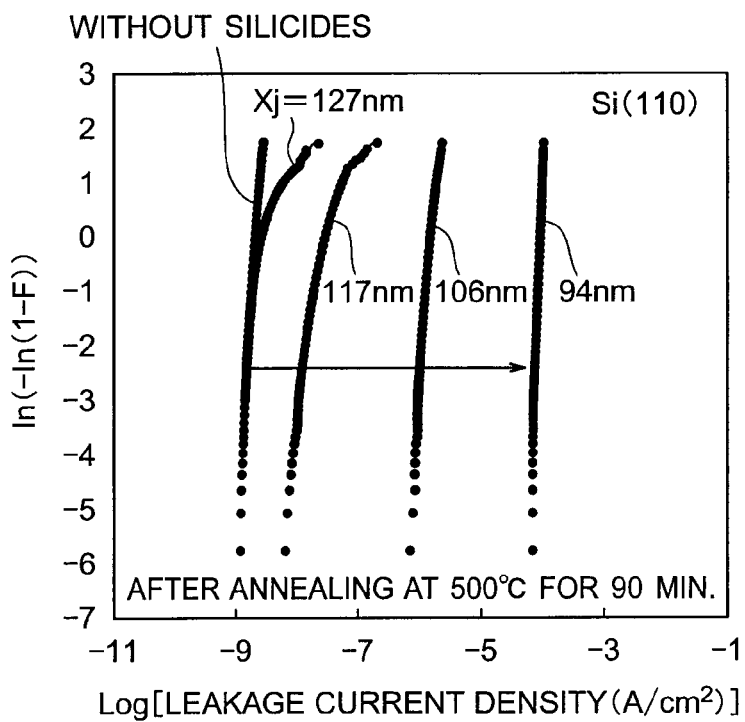
FIG. 2 is a Weibull plot of areal leakage levels over 312 large junctions (i.e., 1×1 mm² square junctions) at various depths for Si(110) substrates.

Similarly, FIG. 2 shows a Weibull plot of areal leakage levels over 312 large junctions (i.e., 1×1 mm² square junctions) at various depths for Si(110) substrates.

Figure 3:
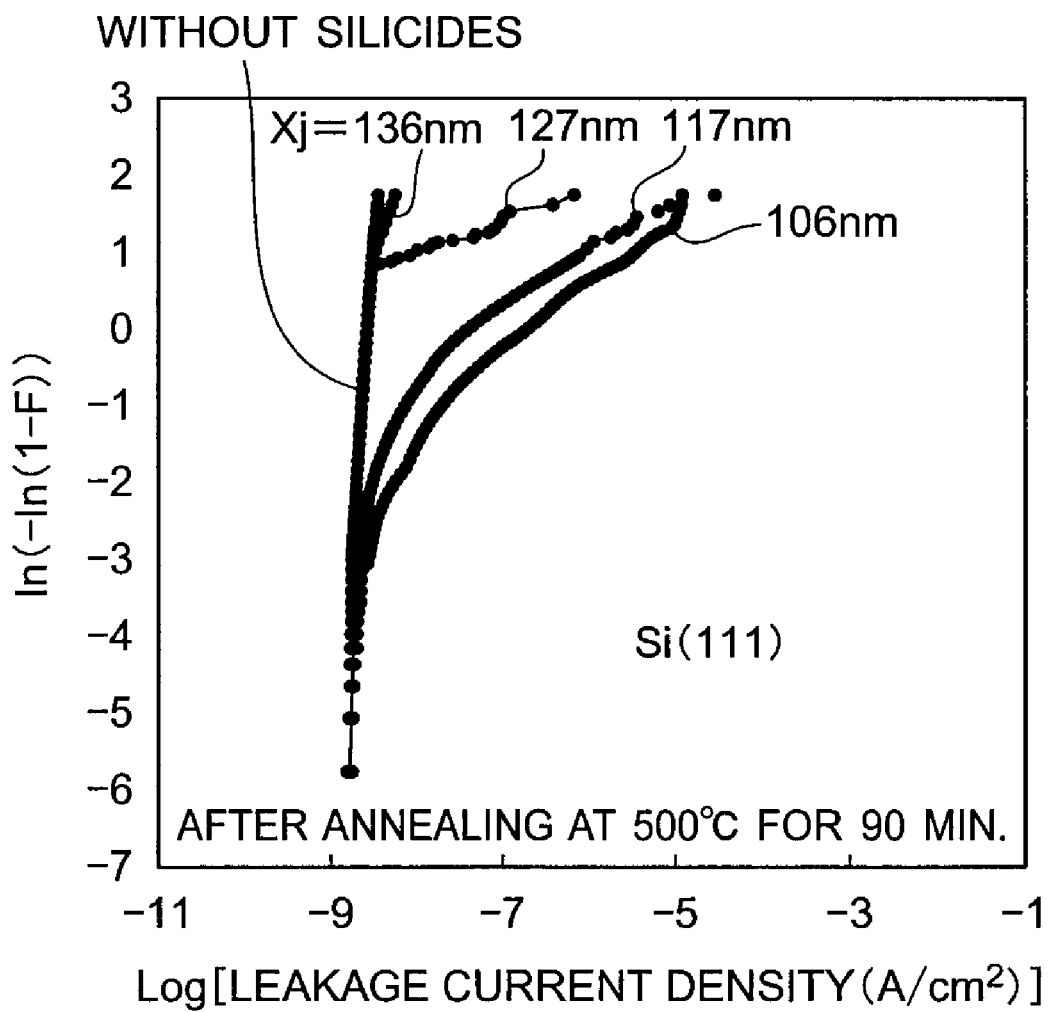
FIG. 3 is a Weibull plot of areal leakage levels over 312 large junctions (i.e., 1×1 mm² square junctions) at various depths for Si(111) substrates.

Likewise, FIG. 3 shows a Weibull plot of areal leakage levels over 312 large junctions (i.e., 1×1 mm² square junctions) at various depths for Si(111) substrates.

Regarding NiSi Layer on Formed {100} Plane

As shown in FIG. 1, with the decrease of the junction depth $x_j$, the junction leakage increases while maintaining virtually vertical Weibull plots. In other words, as the junction depth becomes smaller, substantial leakage is generated uniformly in all the junctions without exception. This proves leakage generation by numerous small leakage sources. Obviously, due to Ni atoms diffused into the Si substrate, a large number of small gap states are formed, facilitating generation of leakage current (as disclosed by M. Tsuchiaki in Jpn. J. Appl. Phys., Vol. 43, p. 5166 (2004), for example).

Regarding NiSi Layer on Formed {110} Plane

As shown in FIG. 2, with the decrease of the junction depth $x_j$, the junction leakage increases while maintaining virtually vertical Weibull plots, just like the case for the previous Si(100) substrates. Thus, also for Si(110) substrates, a large number of small gap states must have been formed by Ni atoms diffused into the Si substrate, thereby facilitating leakage generation.

Regarding NiSi Layer on Formed {111} Plane

Strikingly, however, the way of leakage generation in the Si(111) substrates is totally different from that in the Si(100) and Si(110) substrates.

As shown in FIG. 3, unlike Si(100) and Si(110) substrates, the Weibull plots have specific non-linear structure, bended around the middle portions. They can be decomposed into upper tilted parts and lower vertical parts. With the decrease of the junction depth $x_j$, the length of the upper parts increases, whereas lower parts remain to be aligned on a common vertical line.

This means that, in some junctions (as represented by the lower vertical part of the Weibull plot), no excess leakage is generated at all by the NiSi layer. On the other hand, in the other junctions (as represented by the upper tilted part of the Weibull plot), substantial leakage is generated by the NiSi layer.

The stochastic nature of this leakage generation indicates leakage generation by a small number of sporadic but highly destructive leakage sources.

Such random and devastating leakage can be generated by deep protrusion of silicide layer into Si substrate (commonly referred to as silicide spike).

[Emission Microscopy]

In order to confirm the above-speculated leakage generation by silicide spikes, the leaky junctions on Si(111) are analyzed by emission microscopy. More specifically, by applying a high reverse bias to the junctions, light emission from those samples was monitored.

Figure 4:
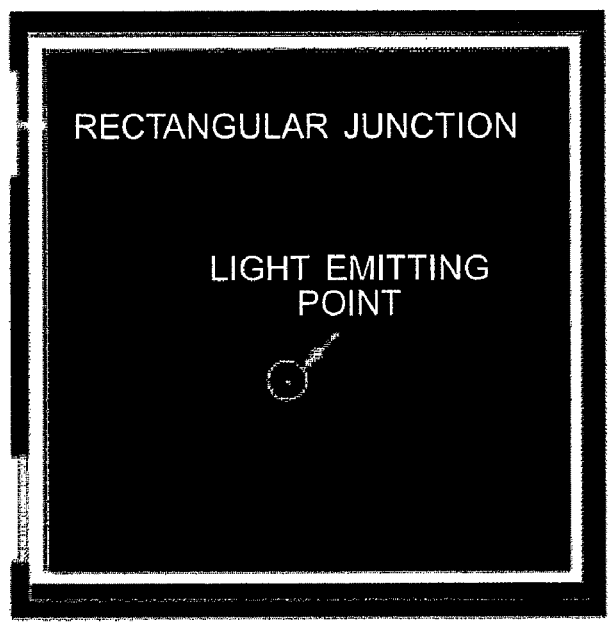
FIG. 4 is an emission microscopy image showing light emission from a junction with NiSi layer formed on Si{111}.

As shown in FIG. 4, the analysis revealed very localized light emission, pointing to concentrated leakage generation at specific isolated spots. Obviously, intense flows of accelerated carriers through the localized points have emitted photons through carrier-scattering or radiative-recombination.

[TEM Analysis]

In order to secure conclusive evidence of the leakage generator on Si(111), the light emitting spots were investigated with a transmission electron microscope (TEM).

Figure 5:
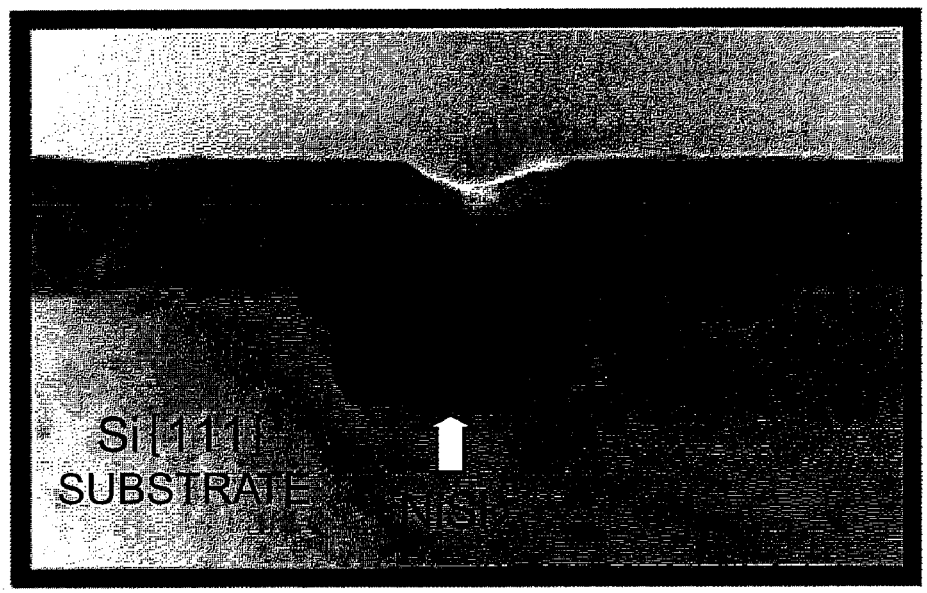
FIG. 5 is a typical cross-sectional TEM image of an emission point of the NiSi layer of FIG. 4.

FIG. 5 shows a typical cross-sectional TEM image of the emission points. Evidentially, the silicide layer takes irregular structure, protruding into the silicon substrate.

The chemical composition of the protrusion (i.e., silicide spike) was analyzed by EDX (Energy Dispersive X-ray Spectroscopy). It is found that the silicide spike is made of $NiSi_2$ phase.

It entails that the Si{111} is a very singular plane, on which phase transition from NiSi to $NiSi_2$ can proceed even at a temperature as low as 500° C. The phase transition and associated restructuring of the silicide layer must have invoked mass transport of Ni atoms, resulting in occasional protrusions ("silicide spikes") into the substrate. An excellent lattice matching between Si{111} and $NiSi_2${111} may have contributed to the emergence of this peculiar phenomenon on Si{111}.

It should be also noted here that, when a NiSi layer is formed on Si{100} or Si{110}, the phase transition from NiSi to $NiSi_2$ has never been observed at such a low temperature.

Now it is clear that the mechanism of leakage generation strongly depends on the crystal orientation of the Si substrate, on which the NiSi layer is formed.

For NiSi layers on Si{100} or Si{110}, infiltration of Ni atoms into the Si substrate and associated numerous gap-states formation is the root cause of the leakage.

For NiSi layers on Si{111}, however, premature phase transition and associated silicide spike formation is the fundamental origin of the leakage.

Here, it should be emphasized that, as exemplified by the alignment of the lower parts of the Weibull plots to a common vertical line (see FIG. 3), NiSi on Si{111} is free from numerous gap-states formation due to deep ingression of Ni atoms into the Si substrates. Otherwise, the lower parts of the Weibull plots should have shifted rightward with the decrease of the junction depth, much like the Weibull plots of Si(100) and Si(110) substrates (see FIGS. 1 and 2). This means that, as long as the formation of silicide spikes is prevented, leakage generation on Si{111} can be totally suppressed.

[Dependence of Silicide Spike Generation on Film Stack Structure]

Besides the direct observation of the leakage-generating silicide spikes, we further discovered that the formation of silicide spikes can be prevented by stacking an appropriate film on the NiSi layer formed on Si{111}.

Figure 6A:
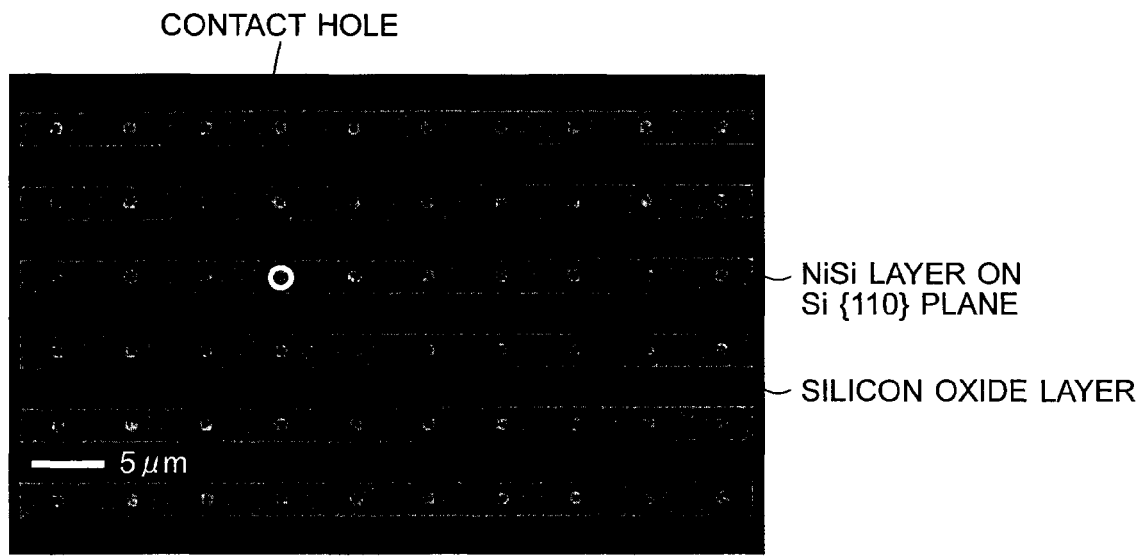
FIG. 6A is a top-view SEM image of fine linear NiSi layers formed on Si{111}.

FIG. 6A shows a top-view SEM (Scanning Electron Microscope) image of fine linear NiSi layers formed on Si{111}. Polygonal patterns randomly scattering in the NiSi layers correspond to surface asperity induced by silicide spikes. Arrays of white dots indicate contact holes to the NiSi layers.

Figure 6B:
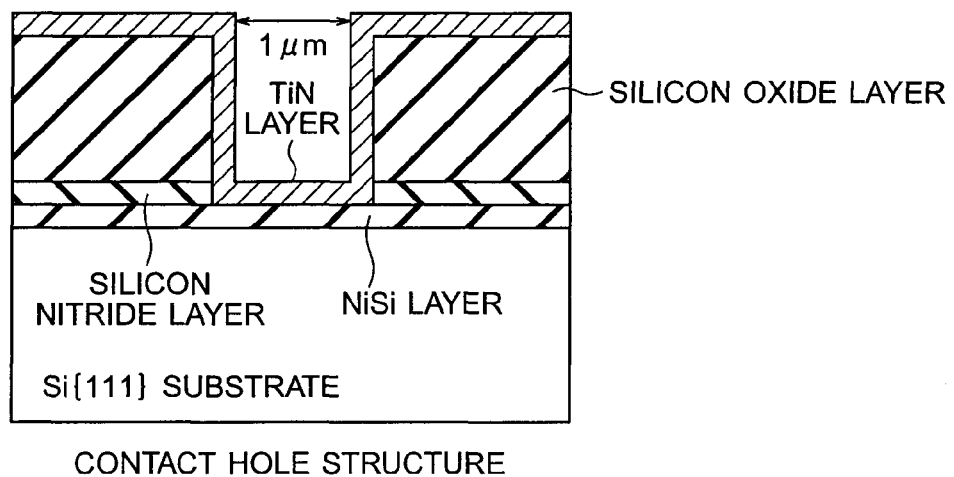
FIG. 6B is a cross-sectional view of a contact hole having a TiN film formed thereon in the structure shown in FIG. 6A.

FIG. 6B explains a cross-section of one of the contact holes. After a NiSi layer was formed, a SiN layer and a $SiO_2$ layer were deposited on the NiSi layer, and a contact hole reaching the NiSi layer was drilled through the $SiO_2$ layer and the SiN layer. Subsequently, a TiN layer was formed entirely over the exterior surface, and the resultant structure was subjected to 500° C. thermal processing for 90 minutes.

As can be seen from FIGS. 6A and 6B, a large number of silicide spikes were formed in the NiSi layer region on which the SiN layer was directly stacked over the NiSi layer, but no silicide spikes were formed in the NiSi layer region on which the TiN layer was directly stacked over the NiSi layer (i.e., within the contact holes, see within the white dots).

Figure 6C:
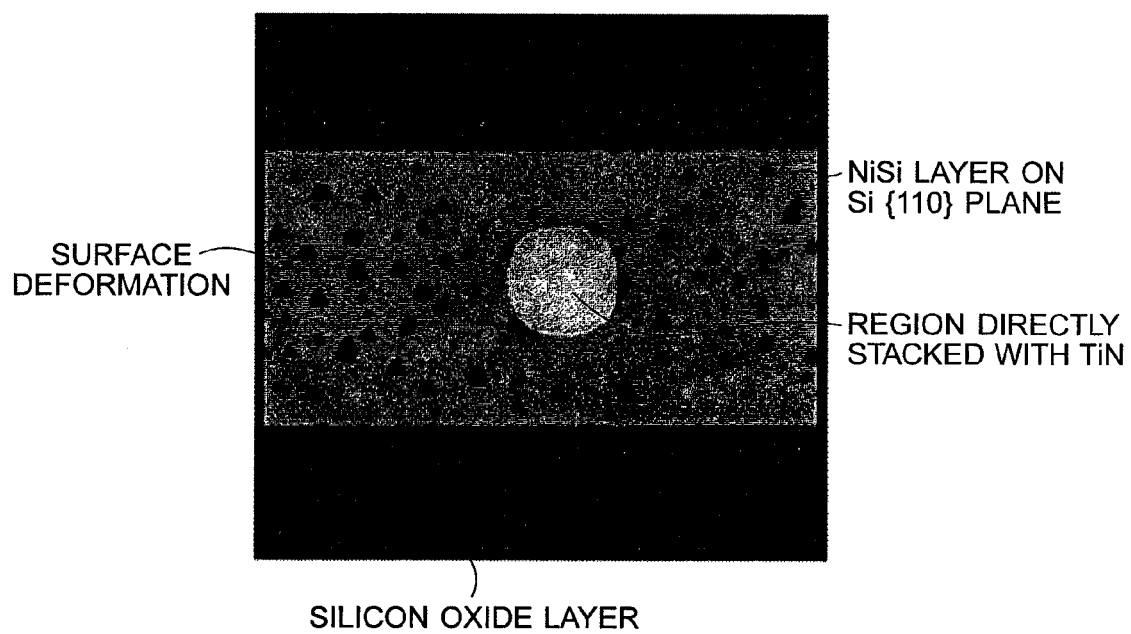
FIG. 6C is an enlarged view of a NiSi region on which a TiN layer is directly stacked (i.e., the white-dot pattern in the structure shown in FIG. 6A)

FIG. 6C is an enlarged view of a NiSi layer region on which a TiN layer is directly stacked over the NiSi layer (the white-dot pattern). Evidently, as long as the TiN layer is stacked on the NiSi layer, surface deformation due to spikes is not observed at all.

Such clear dependence of the spike formation on the contact hole pattern proves, on the other hand, spike formation posterior to the contact hole formation, (i.e., during 500° C. thermal processing), negating spike formation during silicidation reaction.

In addition, it is found that the advantage of stacking the TiN layer on the silicide layer is a unique property exclusively observable on the NiSi layer formed on Si{111}.

Figure 7:
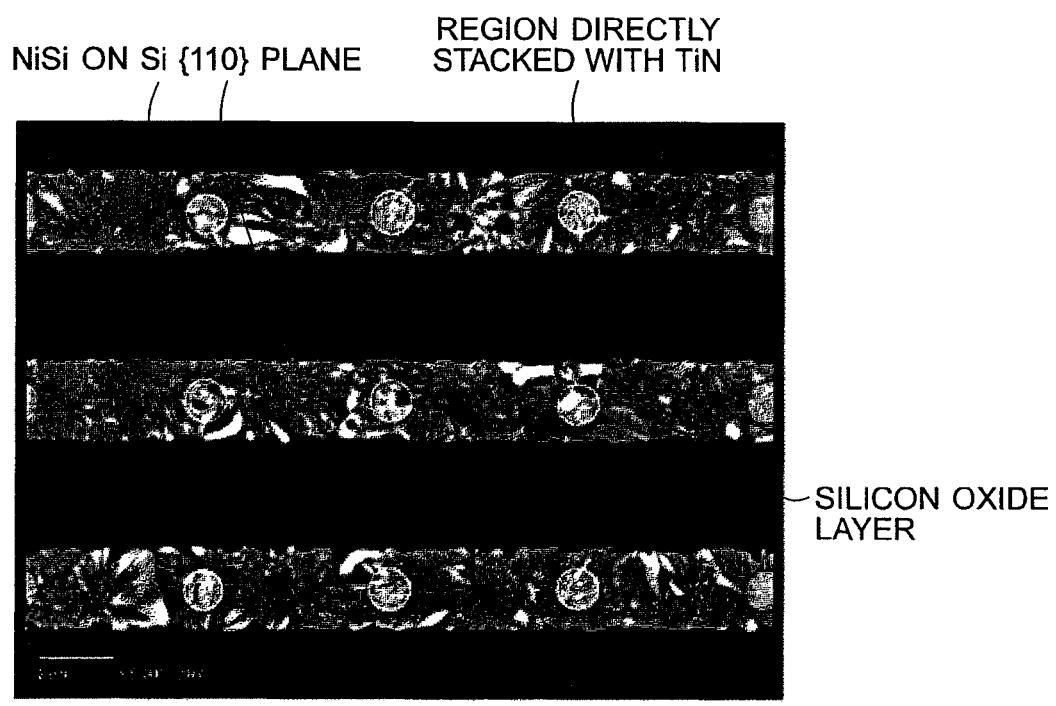
FIG. 7 is a top-view SEM image of fine linear NiSi layers formed on Si{100}.
Figure 8:
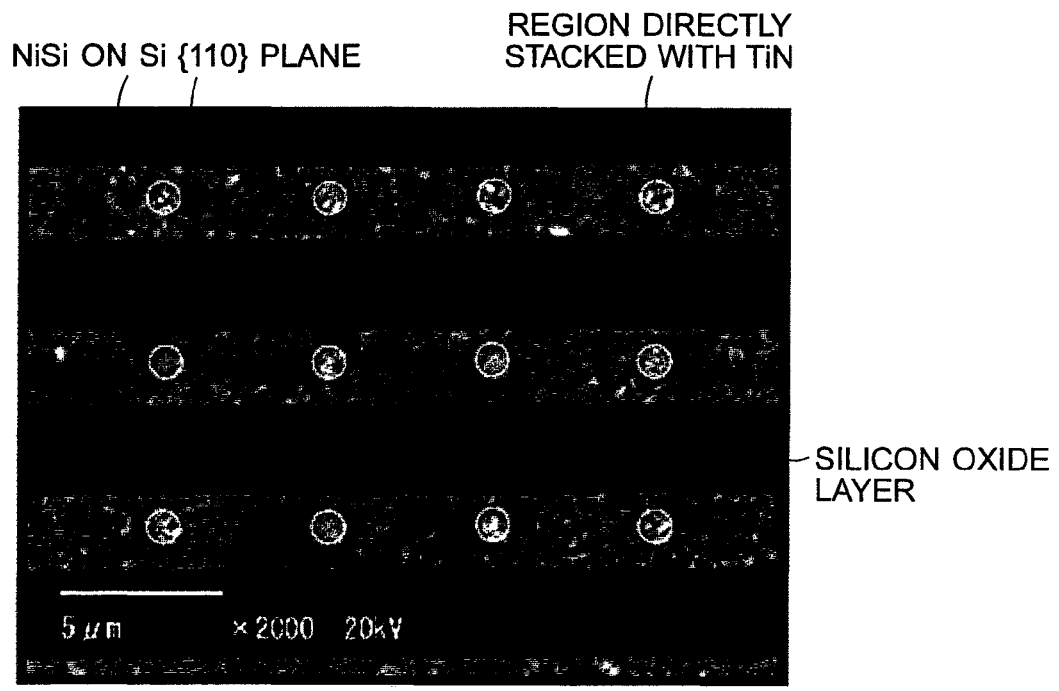
FIG. 8 is a top-view SEM image of fine linear NiSi layers formed on Si{110}.

FIGS. 7 and 8 show top-view SEM images of fine linear NiSi layers formed on Si{100} and Si{110}, respectively.

In fact, deformation of the NiSi layers and associated irregular black patters are clearly visible irrespective of the presence of the contact holes (i.e., within the white dots).

As previously stated, the way of leakage generation in the Si(100) and Si(110) substrates is totally different from that in the Si(111) substrates. For NiSi layers on Si{100} or Si{110}, infiltration of Ni atoms into the Si substrate and associated numerous gap-states formation was the root cause of the leakage. Thus, the irregular black patters in the SEM images must correspond to disappearance of the NiSi layers due to substantial Ni in-diffusion into the substrates. Notably, this substantial Ni in-diffusion proceeds regardless of the presence of the TiN layer stacked over the NiSi layer.

[Crystal Alignment of NiSi Layers]

In order to identify the physical origin of this unique advantage of TiN over NiSi on Si{111}, first, XRD (X-Ray Diffraction) analysis was carried out to analyze the crystal orientations of the NiSi layers.

Figure 9:
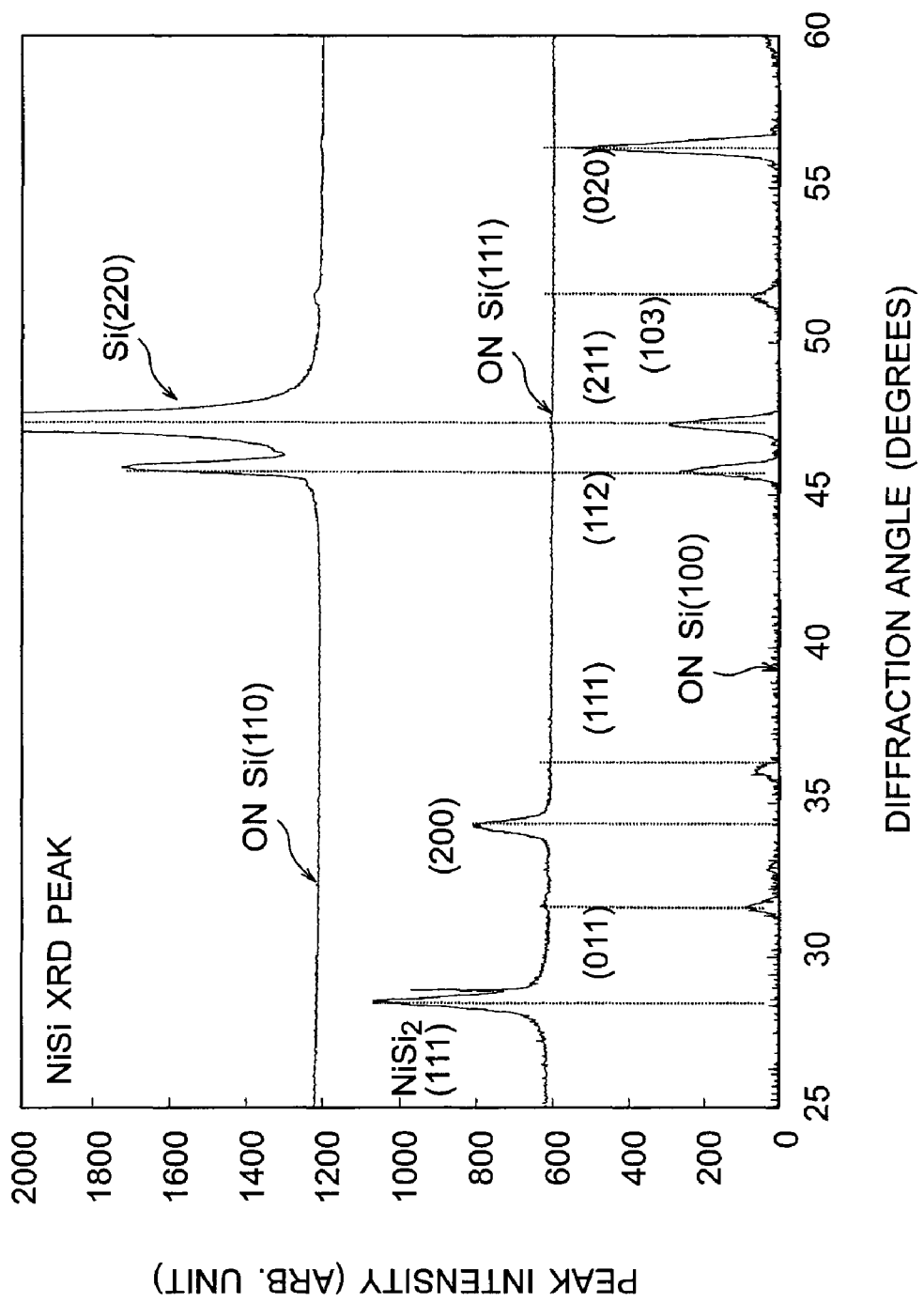
FIG. 9 shows XRD spectra of NiSi layers formed on Si{100}, Si{110}, and Si{111}.

As can be seen from FIG. 9, on Si(100), the presence of various XRD peaks indicates rather random alignment of polycrystalline NiSi. Stacking a TiN layer on this NiSi layer does not increase the thermal stability of the film.

Unlike Si(100), on Si(110), NiSi is highly oriented. NiSi (112) seems by far to be the most favored orientation. However, again, stacking a TiN layer on this NiSi layer does not increase the thermal stability of the film.

Similar to Si(110), NiSi is also highly oriented on Si(111). Except NiSi$_2$(111) peak corresponding to the existence of spikes, only NiSi(200) peak is observed. This means that the NiSi on Si{111} is made up of a crystal or poly-crystals whose {100} planes are aligned to be parallel to the Si{111} plane. Hereinafter, this crystal alignment of the NiSi layer will be simply referred to as an alignment in the NiSi(200) direction, for short.

It should be noted that, on this particular NiSi alignment in the NiSi(200) direction, stacking of a TiN layer improves thermodynamic stability of the NiSi layer, thereby, preventing silicide spike formation. As stated above, without spikes, leakage generation on Si{111} can be totally suppressed.

In practice, this beneficial effect of TiN can be exploited as follows.

With an elevated source drain method, Si{111} surface can be formed in regions adjacent to an gate electrode over the the extension regions. Then, a NiSi layer is formed on Si{111}. Subsequently, gate sidewalls made of TiN are further stacked on the NiSi layer.

Since TiN suppresses infiltration of Ni atoms from the silicide layer into the substrate in the region adjacent to the gate electrode, generation of junction leakage current can be prevented. With leakage-free silicidation over the source/drain extension regions, ultrahigh-speed MOSFETs can be realized. Improved thermal stability of the NiSi layer also enables to establish excellent electric contacts to the wiring metal through sufficient annealing.

Alternatively, the extension regions and the source/drain regions themselves may be made of Si{111} planes and a NiSi layer can be formed on the extension regions and the source/drain regions. A TiN layer is further stacked on the NiSi layer, so as to obtain a ultrahigh-speed, leakage-free and thermally robust MOSFETs with excellent electric contacts with the wiring metal.

The following is a detailed description of preferred embodiments of the present invention.

First Embodiment

A semiconductor device in accordance with a first embodiment of the present invention is now described. The semiconductor device of this embodiment includes complementary MOSFETs (C-MOSFETs) each having an elevated source/drain structure formed on the {100} plane of Si. In this semiconductor device, Si{111} planes are formed in regions adjacent to the gate electrode, and a NiSi layer is formed on the Si{111} planes. A gate sidewall made of TiN is further stacked on the NiSi layer.

This embodiment realizes a high-speed C-MOSFET structure with virtually leakage-free silicided shallow source/drain diffusion layers and excellent electric contacts with wiring metals through improved thermal stability.

Referring now to FIGS. 10 to 18, a method for manufacturing the semiconductor device of this embodiment is described.

Figure 10:
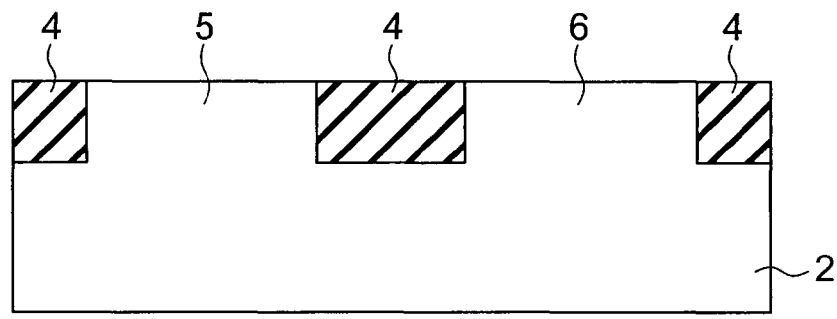
FIGS. 10 to 18 are cross-sectional views showing the procedures for manufacturing a semiconductor device according to a first embodiment.

First, as shown in FIG. 10, shallow trenches for device isolation are formed in a semiconductor substrate, 2, made of p-type single-crystal silicon having a (100) plane as a principal surface. The trenches are then filled with insulating film such as silicon oxide film, so as to form device isolating regions 4. With the device isolating regions 4, a device region 5 for an n-MOSFET and a device region 6 for a p-MOSFET are demarcated. This structure can be obtained by effective known techniques. More specifically, the silicon substrate 2 having those device isolating regions 4 can be obtained, for example, by forming the trenches in the substrate surface with lithography and RIE (reactive ion etching), depositing insulating film on the substrate surface by CVD (chemical vapor deposition), and planarizing the substrate surface by CMP (chemical mechanical polishing).

Figure 11:
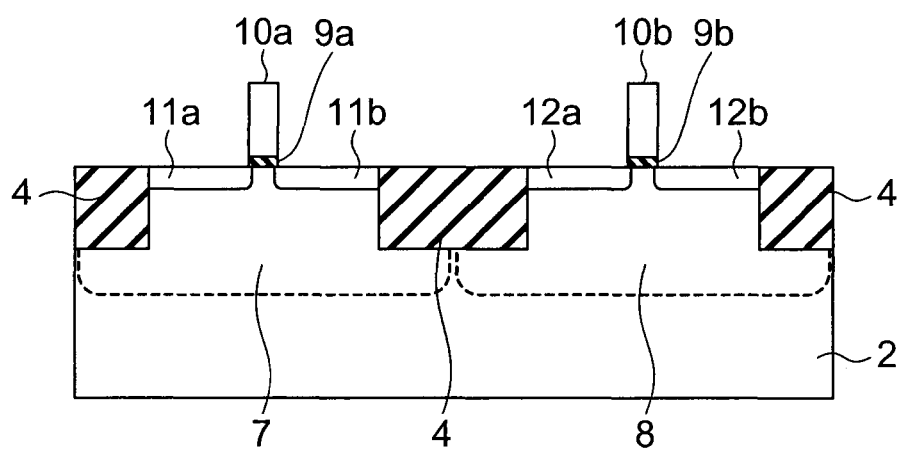

As shown in FIG. 11, a p-type well region 7 in the n-MOSFET formation region 5 and an n-type well region 8 in the p-MOSFET formation region 6 are formed by effective known techniques such as ion implantation and heat treatment. A gate insulating film such as an oxynitride film of e.g., 5 nm in film thickness is formed on the entire surface of the substrate 2 by an effective conventional technique such as a thermal oxynitridation technique. A gate electrode film such as a polysilicon film of e.g., 20 nm in film thickness is deposited over the gate insulating film by an effective conventional technique such as CVD. After forming photoresist masks by lithography, the gate electrode film and the gate insulating film material are patterned by RIE or the like, so as to form a gate insulating film 9a and a gate electrode 10a on the p-type well region 7, and a gate insulating film 9b and a gate electrode 10b on the n-type well region 8. The gate electrodes 10a and 10b are formed along the <110> direction of Si.

The n-type well region 8 and the gate electrode 10b are then covered with a photoresist. Using the gate electrode 10a together with the photoresist as masks, n-type impurity ions are implanted into the p-type well region 7, so as to form n-type extension regions 11a and 11b with shallow junction depths (see FIG. 11). The photoresist is then removed, and the p-type well region 7 and the gate electrode 10a are next covered with a photoresist. Using the gate electrode 10b together with the photoresist as masks, p-type impurity ions are implanted into the n-type well region 8, so as to form p-type extension regions 12a and 12b with shallow junction depths. The photoresist is then removed (see FIG. 11). In this embodiment, the n-type extension regions 11a and 11b are formed before the p-type extension regions 12a and 12b are formed. However, the p-type extension regions 12a and 12b may be formed before the n-type extension regions 11a and 11b are formed.

A silicon nitride (SiN) film of e.g., 10 nm in film thickness is then deposited on the entire surface by CVD. After that, a carbon film of e.g., 30 nm in film thickness is deposited so as to cover the silicon nitride film by a sputtering technique, for example. Anisotropic etching such as RIE is then performed to form SiN gate sidewalls 13a and carbon gate sidewalls 14a on both sides of the gate electrode 10a, and SiN gate sidewalls 13b and carbon gate sidewalls 14b on both sides of the gate electrode 10b (see FIG. 12).

The n-type well region 8 and the gate electrode 10b are next covered with a photoresist. N-type impurity ions are implanted into the p-type well region 7, so as to form n-type diffusion layers 15a and 15b having larger junction depths than the n-type extension regions 11a and 11b (see FIG. 12). At this point, n-type impurity ions are implanted into the gate electrode 10a. The photoresist is then removed, and the p-type well region and the gate electrode 10a are next covered with a photoresist. P-type impurity ions are implanted into the n-type well region 8, so as to form p-type diffusion layers 16a and 16b having larger junction depths than the p-type extension regions 12a and 12b. The photoresist is then removed (see FIG. 12). At this point, p-type impurity ions are implanted into the gate electrode 10b. In this embodiment, the n-type diffusion layers 15a and 15b are formed before the p-type diffusion layers 16a and 16b are formed. However, the p-type diffusion layers 16a and 16b may be formed before the n-type diffusion layers 15a and 15b are formed. The n-type diffusion layer 15a and the n-type extension region 11a form one of the n-type source/drain regions, such as the n-type source region. The n-type diffusion layer 15b and the n-type extension region 11b form the other one of the n-type source/drain regions, such as the n-type drain region. The p-type diffusion layer 16a and the p-type extension region 12a form one of the p-type source/drain regions, such as the p-type source region. The p-type diffusion layer 16b and the p-type extension region 12b form the other one of the p-type source/drain regions, such as the p-type drain region.

Subsequent rapid thermal annealing activates the implanted impurities. Through this heat processing, the diffusion layers 15a, 15b, 16a, and 16b could reach as deep as 50 nm from the surface of the silicon semiconductor substrate 2, for example.

The gate sidewalls 14a and 14b formed with the carbon film are then selectively removed by exposing to oxygen plasma.

Figure 13:
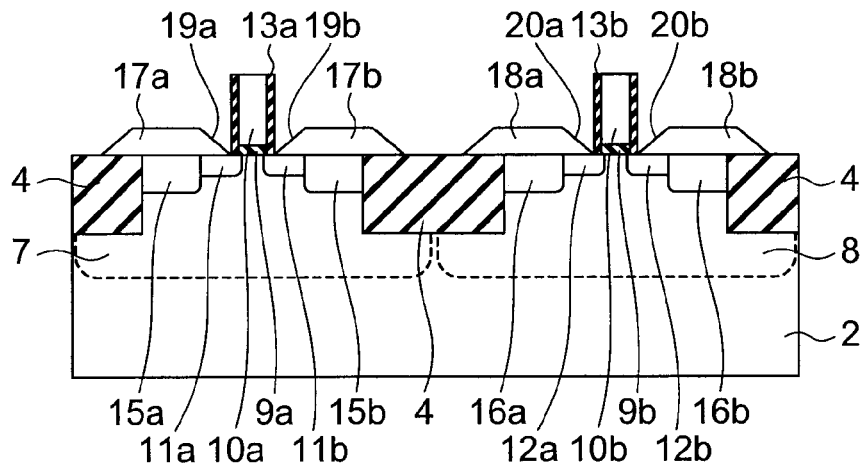

Next, as shown in FIG. 13, an additional single crystals silicon layer 17a is formed over the extension region 11a and the diffusion layer 15a. An additional single crystals silicon layer 17b is also formed over the extension region 11b and the diffusion layer 15b. An additional single crystals silicon layer 18a is formed over the extension region 12a and the diffusion layer 16a. An additional single crystals silicon layer is also formed over the extension region 12b and the diffusion layer 16b. With the epitaxial growth method, those additional silicon layers 17a, 17b, 18a, and 18b can be obtained, e.g., by providing $SiH_2Cl_2$ gas at a flow rate of 300 $cm^3$/min, HCl gas at a flow rate of 200 $cm^3$/min, and $H_2$ gas at a flow rate of 10000 $cm^3$/min at 10 Torr and 800° C. Each of the additional silicon layers 17a, 17b, 18a, and 18b is designed to have a thickness of approximately 50 nm.

However, since epitaxial growth on Si{111} is slower than that on Si{100}, Si{111} facet planes 19a, 19b, 20a, and 20b develop in the regions adjacent to the gate electrodes, as shown in FIG. 13. The epitaxial layers also grow in the horizontal direction at the boundaries with the device isolating regions 4, and come to extend over the device isolating regions 4. Obviously, these additional silicon layers 17a, 17b, 18a, and 18b form parts of the source/drain electrodes. Because the source/drain electrodes are made to partially extend over the device isolating regions 4, the capacitive coupling with the substrate 2 can be reduced, securing higher-speed device operation in this embodiment. Although not explicitly shown in FIG. 13, it should be understood that additional silicon layers are also formed on the gate electrodes 10a and 10b. During the epitaxial growth, a conductive impurity may be incorporated in the supply gases so as to make additional silicon layers conductive. Alternatively, it is also possible to additionally implant impurity ions. Of course, the additional silicon layers may be formed before formation of the diffusion layers 15a, 15b, 16a, and 16b, and diffusion layers may be formed together with the doping of the additional silicon layers.

Subsequently, Ni is deposited on the entire surface by an effective conventional technique such as a sputtering technique, so as to form a Ni layer having a film thickness of 12 nm, for example. If necessary, a capping-layer made of a metal material such as Ti or TiN may be further deposited over the Ni layer. The semiconductor substrate is then subjected to rapid thermal processing in a nitrogen atmosphere at 450° C. for 30 seconds, for example. Silicidation reaction proceeds exclusively where the Ni and the silicon are in direct contact. Unreacted Ni is selectively wet-etched in a liquid mixture of sulfuric acid and hydrogen peroxide. The Ti or TiN capping-layer is also completely removed by the wet-etching. Therefore, it should be understood that, by this self-aligning silicide formation (i.e., SALICIDE method), the TiN layer can not remain at this stage.

Figure 14:
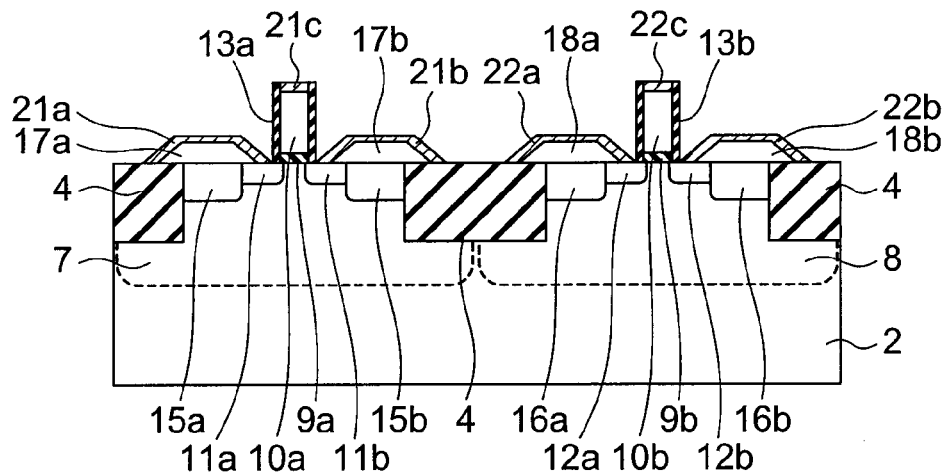

As a result, NiSi layers 21a and 21b are formed on the additional silicon layers 17a and 17b, and a NiSi layer 21c is formed on the gate electrode 10a, as shown in FIG. 14. Also, NiSi layers 22a and 22b are formed on the additional silicon layers 18a and 18b, and a NiSi layer 22c is formed on the gate electrode 10b. NiSi layers are of course formed also on the Si{111} facet planes 19a, 19b, 20a, and 20b.

Figure 15:
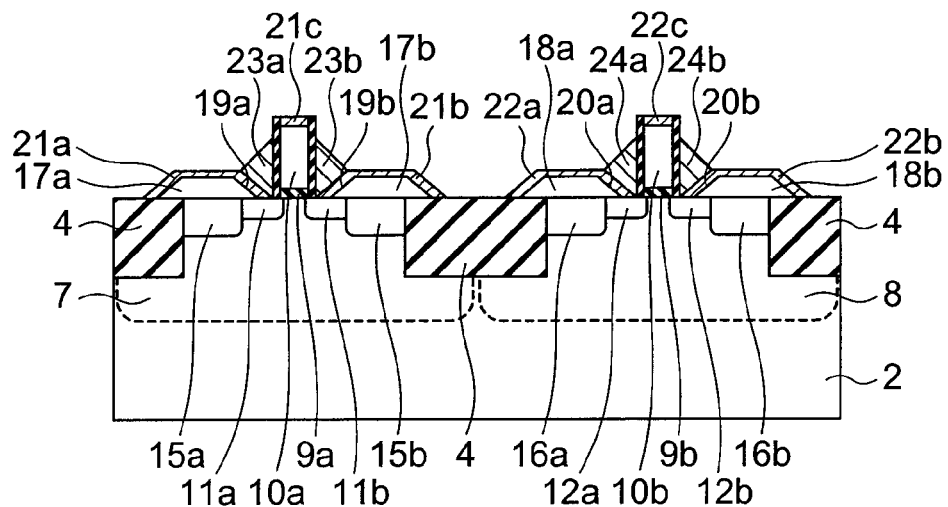

As shown in FIG. 15, a Ti nitride (TiN) film is then deposited over the entire surface by an effective conventional technique such as a sputtering technique or a CVD technique utilizing an organic compound containing Ti and N (TDMA (Tetrakis-DiMethyl-Amino-titanium, for example). Ensuing RIE or the like selectively leaves the TiN film on both sides of the gate electrodes 10a and 10b, to form TiN gate sidewalls 23a, 23b, 24a, and 24b. It is preferable that the film thickness of the TiN film is adjusted so that the gate sidewalls 23a, 23b, 24a, and 24b cover the NiSi layers formed on the Si{111} facet planes 19a, 19b, 20a, and 20b. Meanwhile, the unnecessary portions of the TiN film can be readily removed by making use of lithography and wet-etching.

Obviously, adjacent to the gate electrodes 10a and 10b, the NiSi layers 21a, 21b, 22a, and 22b are formed on the Si{111} planes. Accordingly, the corresponding portions of NiSi are oriented in the NiSi(200) direction, and thus, free from numerous gap-states formation due to deep ingression of Ni atoms into the Si substrates. Furthermore, since the TiN films are stacked over those NiSi portions, the improved thermodynamic stability of the NiSi layer prevents silicide spike formation around the critical regions adjacent to the gate electrodes, even if thermal processing at 500° C. is performed hereafter. This means that junction leakage can be effectively suppressed even though the NiSi layers are formed over the very shallow junctions of the extension regions 11a, 11b, 12a, and 12b.

In addition, the metallic materials (i.e., NiSi and TiN) over the extension regions 11a, 11b, 12a, and 12b, reduce electric resistance of these portions, preventing wasteful electric potential drop, and therefore, allowing sufficient channel current to flow through the extension regions into the NiSi layers 21a, 21b, 22a, and 22b. Thus, MOSFETs with high-speed operation can be realized.

Of course, each of the NiSi layers formed on the Si{100} planes is located far above the junction. Accordingly, junction leakage due to infiltration of Ni atoms into the Si substrate is effectively suppressed.

Needless to say, the NiSi layers on the Si{111} planes at the boundaries with the device isolating regions 4 are located over the device isolating regions 4. The distance from the NiSi layers to the junctions is also large. Thus leakage from these portions can be prevented.

Figure 16:
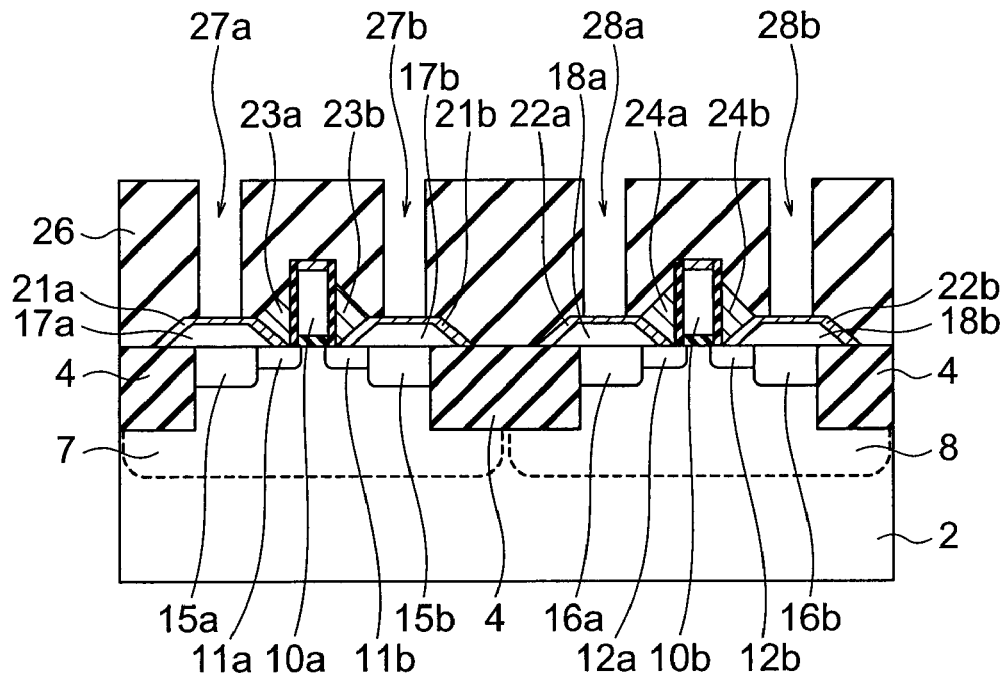

Next, as shown in FIG. 16, an interlayer insulating film 26 is deposited on the entire surface. The interlayer insulating film 26 may be a stack of a thin silicon nitride film and a silicon oxide film, for example. Then, contact holes 27a, 27b, 28a, and 28b are drilled through the interlayer insulating film 26, to expose the NiSi layers 21a, 21b, 22a, and 22b, by known techniques such as lithography and RIE. Here, it is preferable to perform the contact-hole RIE in two steps. First etching should be selective removal of the silicon oxide film of the interlayer insulating film 26, using the underling silicon nitride film as an etching-stopper. Subsequent short-time etching of the remaining thin silicon nitride film can avoid excessive plasma damage inflicted on the bottom of the contact holes. The quick completion of the second etching also prevents deep encroachment of the contact holes into the isolation insulators, even when the bottoms of the contact holes accidentally fall upon the device isolating regions due to misalignment of the contact-hole patterns to the source-drain regions. Resulting process tolerance for less accurate alignment of contact-hole patterns to the NiSi layers enables easy contact formation (i.e., "borderless contact formation") and improves manufacturability of the devices. Accordingly the production costs can be reduced.

Naturally, as an etching stopper, the silicon nitride film should be dense, uniform and conformal to the exterior surfaces of very fine structures of advanced semiconductor devices. If the silicon nitride film is porous and of low integrity, it cannot function as a barrier layer or an etching stopper layer. If the silicon nitride film is inhomogeneous, it cannot cope with fine structures of advanced semiconductor devices. To obtain a dense and uniform silicon nitride film, the chemical vapor deposition (CVD) method with a supply gas containing $Si_2Cl_6$ and $NH_3$ or the atomic layer deposition (ALD) method using $SiH_2Cl_4$ and $NH_3$ is preferred to the plasma enhanced CVD (PECVD) method, though PECVD allows low temperature formation.

In this embodiment, thermal stability of the NiSi layers in the extension regions is improved with the TiN layers stacked over them. Accordingly, a dense and uniform silicon nitride film can be readily formed using CVD or ALD at a film formation temperature of 500° C. or higher.

Figure 17:
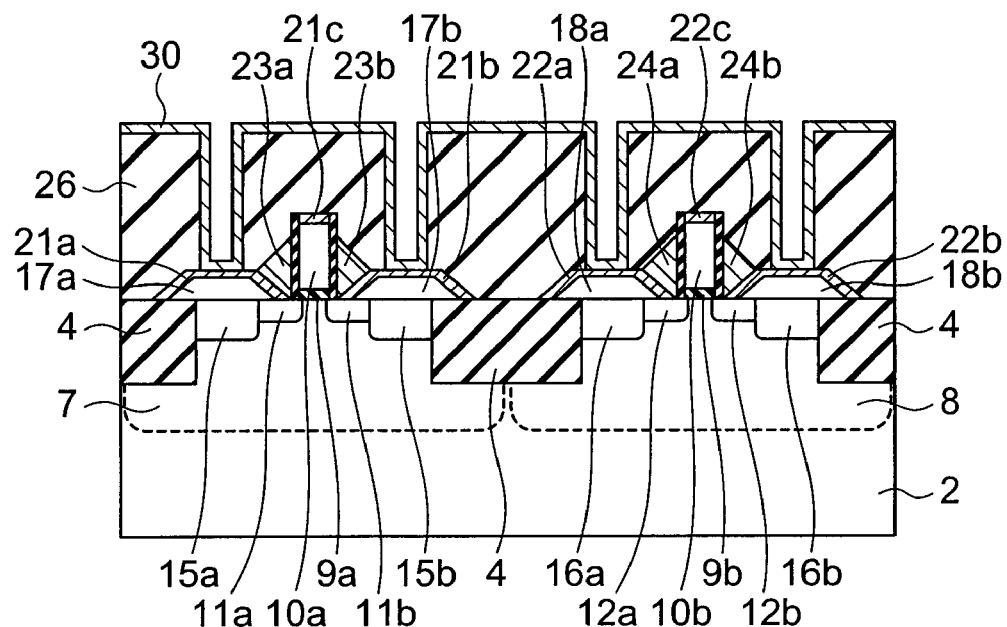

Then, as shown in FIG. 17, the NiSi layers 21a, 21b, 22a, and 22b at the bottoms of the contact holes are exposed to a plasma containing $NF_3$, to clean the surfaces of the NiSi layers 21a, 21b, 22a, and 22b. To prevent harmful impurities and unnecessary materials to reach the source-drain regions, a layer of barrier metal, such as a Ti layer 30 having a thickness of e.g., 5 nm, is formed over the entire surface of the semiconductor substrate 2 by a sputtering technique. Subsequently, heat treatment is carried out in a nitrogen atmosphere at 500° C., for example, to establish excellent electric contacts with the NiSi layers 21a, 21b, 22a, and 22b. With the help of Ti's strong tendency to chemical reduction, thin oxide films, that inevitably form on air-exposed surfaces of the NiSi layers, can be broken off and removed, resulting in the excellent electrical contacts.

It should be repeated here that a heat treatment at approximately 500° C. is normally necessary for this purpose. At a lower temperature, the thin oxide films on the surfaces of the NiSi layers cannot be broken off and removed.

In this embodiment, thanks to the improved thermal stability attained by the NiSi layers on Si{111} with TiN overlayers, excellent electric connections can be achieved through sufficient heat treatment at 500° C. or higher without generation of leakage current. Otherwise, without the benefits of the present invention, due to poor thermal stability of the NiSi layer, the heat treatment temperature has to be strictly limited below 500° C. so as to prevent diffusion and infiltration of the Ni atoms into the Si substrate. As a result, the contact resistance of the source/drain regions remains high, lowering the yield of successful electric wiring. Thus, the advantages of the formation of the silicide will be completely lost.

Figure 18:
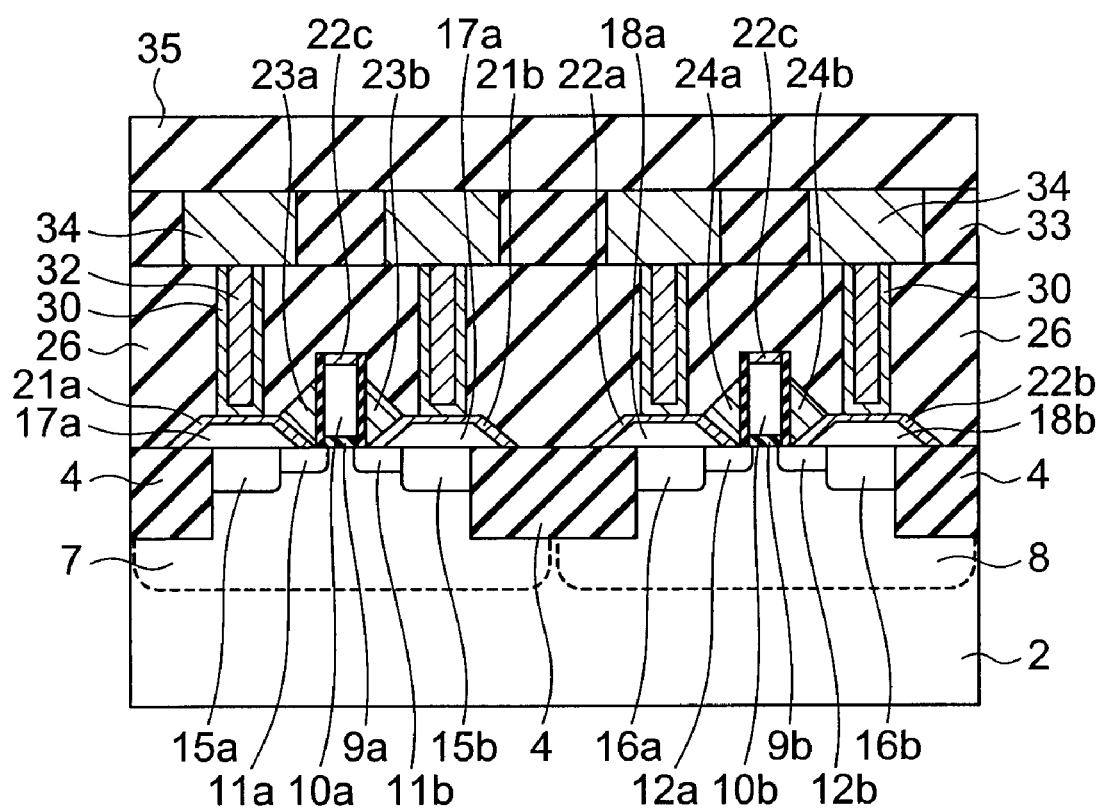

Next, as shown in FIG. 18, the contact holes are filled up with a wiring metal 32, such as W, making use of effective known techniques such as CVD and CMP. After that, a silicon oxide film 33 is deposited as an interlayer insulating film. Grooves to accommodate wiring materials are then formed in the silicon oxide film 33 by known techniques such as lithography and RIE. The grooves are then filled with wiring materials such as Cu wires 34 (the damascene method). An insulating film such as a silicon oxide film 35 is further deposited over the wires 34. If necessary, a multilayer wiring structure may be formed, and dicing, mounting and packaging processes are carried out to complete the semiconductor device.

In the present embodiment, the NiSi layers 21a, 21b, 22a, and 22b are formed on the Si{111} facet planes of the single-crystal silicon layers 17a, 17b, 18a, and 18b in regions adjacent to an gate electrode over the extension regions (i.e., in the regions that have the smallest junction depth). The gate sidewalls made of TiN are further stacked over the NiSi layer. Stacking of the TiN layer improves thermodynamic stability of the NiSi layer, thereby, preventing silicide spike formation. Without spikes, leakage generation can be totally suppressed.

Thus, a high-speed C-MOSFET with leakage-free silicided shallow source/drain diffusion layers and excellent electric contacts with wiring metals can be realized.

In this embodiment, the following effects can be achieved:

(a) When additional silicon layers are selectively formed on the source/drain regions including the extension regions, Si{111} facet planes can be automatically formed in the regions adjacent to the gate electrode where the junction depth is smallest.

(b) Since the additional silicon layers forming parts of the source/drain electrodes are made to partially extend over the device isolating regions 4, the capacitive coupling with the substrate 2 can be reduced, and a higher-speed device operation can be achieved.

(c) Since the NiSi layers are formed on Si{111} and oriented in the NiSi(200) direction in the regions having the smallest junction depth, they are free from leakage generation by numerous gap-states formed through deep ingression of Ni atoms into the Si substrates.

(d) Since the TiN layers are stacked over the NiSi layers oriented in the NiSi(200) direction in the regions having the smallest junction depth, the improved thermodynamic stability of the NiSi layer prevents silicide spike formation around the critical regions adjacent to the gate electrodes, even if thermal processing at 500° C. is performed. Thus, the junction leakage can be effectively suppressed even though the NiSi layers are formed over the very shallow junctions of the extension regions.

(e) Since the metallic materials (i.e., NiSi and TiN) over the extension regions reduce electric resistance of these portions, sufficient channel current is allowed to flow through the extension regions into the NiSi layers. Thus, MOSFETs with high-speed operation can be realized.

(f) Thanks to the improved thermal stability attained by the NiSi layers on Si{111} with TiN over-layers, excellent electric connections can be achieved through heat treatment at 500° C. or higher without generating leakage current.

(g) Thanks to the improved thermal stability attained by the NiSi layers on Si{111} with TiN over-layers, a dense and uniform silicon nitride film that is suitable for a barrier layer or an etching stopper layer can be readily formed.

Although a pair of C-MOSFETs have been described in this embodiment, the above described manufacturing method may be implemented in a structure including more than two devices, and may be implemented selectively in a group of devices forming a part of a semiconductor device.

Also, only a part of the upper portion of each gate electrode is silicided in this embodiment. However, this embodiment may be applied to a case where each gate electrode is fully silicided (Fully-Silicided Gate).

(First Modification)

Figure 19:
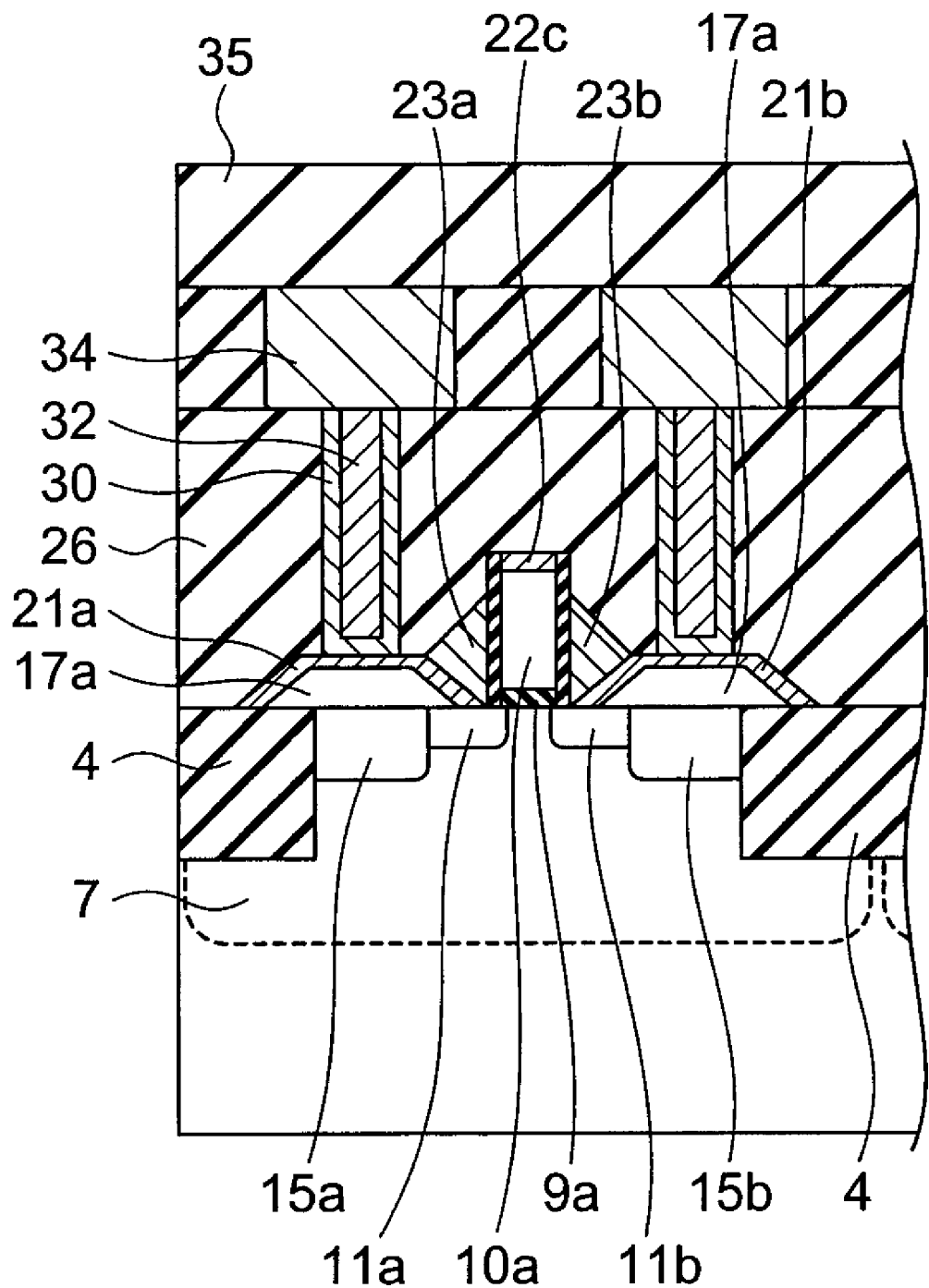
FIG. 19 is a cross-sectional view showing a procedure for manufacturing a semiconductor device according to a first modification of the first embodiment.

FIG. 19 is a cross-sectional view of a semiconductor device in accordance with a first modification of this embodiment. The semiconductor device of this modification includes an n-MOSFET, and this n-MOSFET has the same structure as the n-MOSFET of the C-MOSFET of the first embodiment.

The same effects as those of the first embodiment can be achieved by this modification. Although the semiconductor device of this modification includes an n-MOSFET, the semiconductor device may include a p-MOSFET, instead of the n-MOSFET, and this p-MOSFET may have the same structure as the p-MOSFET of the C-MOSFET of the first embodiment. Such a semiconductor device can also achieve the same effects as those of the first embodiment.

(Second Modification)

Figure 20:
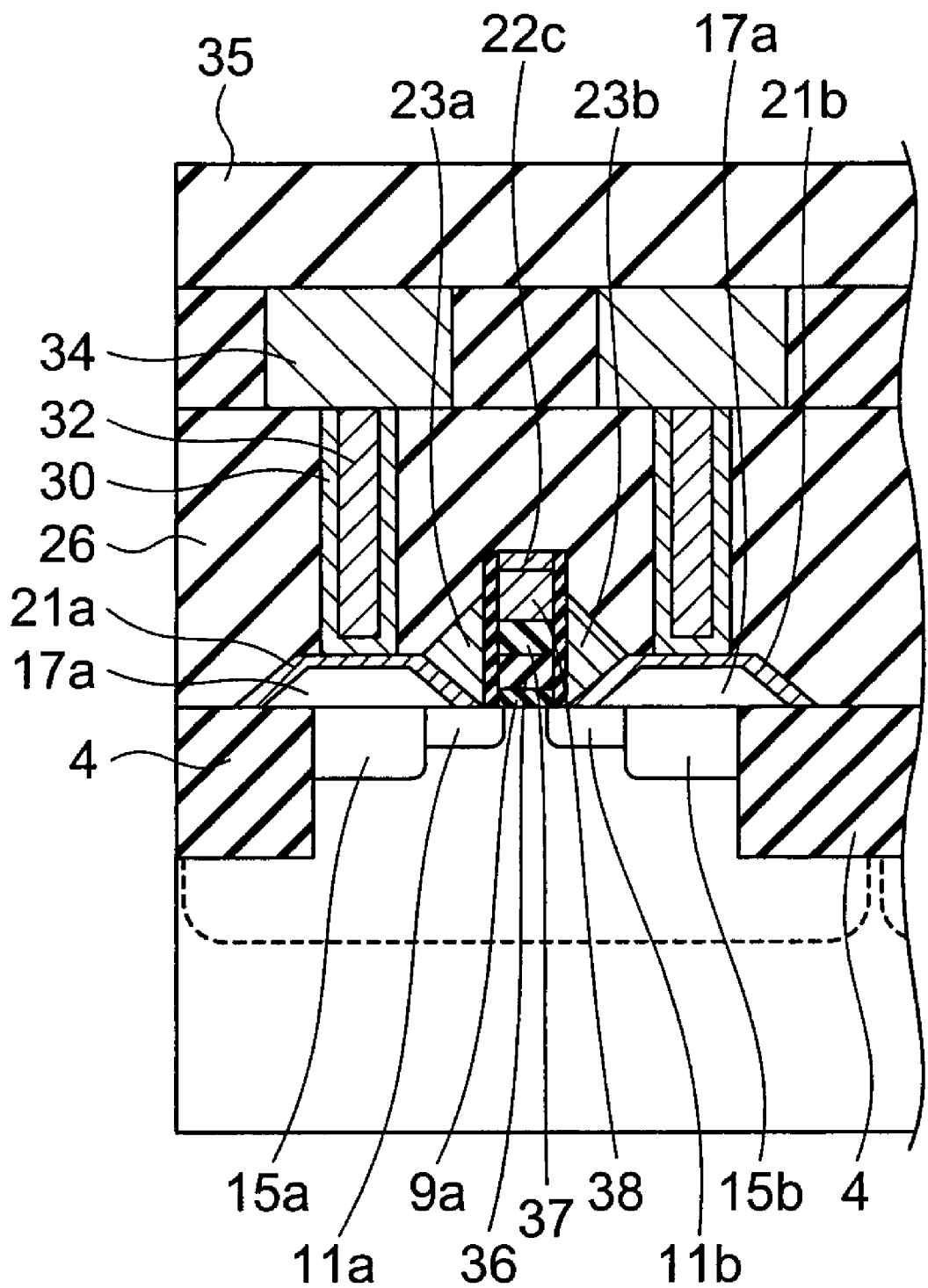
FIG. 20 is a cross-sectional view showing a procedure for manufacturing a semiconductor device according to a second modification of the first embodiment.

FIG. 20 is a cross-sectional view of a semiconductor device in accordance with a second modification of this embodiment. The semiconductor device of this modification is the same as the semiconductor device of the first modification shown FIG. 19, except that the gate has a MONOS (Metal-Oxide-Nitride-Oxide-Semiconductor) structure. More specifically, the gate of the semiconductor device in accordance with this modification has a structure that has a gate insulating film 9a formed on the channel portion of the silicon substrate 2 between the source regions 11a and 15a and the drain regions 11b and 15b, a charge storage film 36 such as a nitride film formed on the gate insulating film 9a, a block insulating film 37 such as an oxide film formed on the charge storage film 36, and a control gate electrode 38 made of a material such as polysilicon formed on the block insulating film 37. It is also possible to form a NiSi layer 22c on the control gate electrode 38, as in the first modification. This modification can also achieve the same effects as those of the first embodiment.

Second Embodiment

Next, a semiconductor device in accordance with a second embodiment of the present invention is described. The semiconductor device of this embodiment includes C-MOSFETs each having an elevated source/drain structure formed on a Si{110} plane. Grooves having Si{111} sidewalls are formed in the source/drain regions, and NiSi layers are formed on the Si{111} sidewalls. Sidewalls made of TiN are further formed to cover the NiSi layers.

This embodiment also realizes a high-speed C-MOSFET structure with virtually leakage-free silicided shallow source/drain diffusion layers and excellent electric contacts with wiring metals through improved thermal stability.

Referring now to FIGS. 21 to 28, a method for manufacturing the semiconductor device of this embodiment is described.

Figure 12:
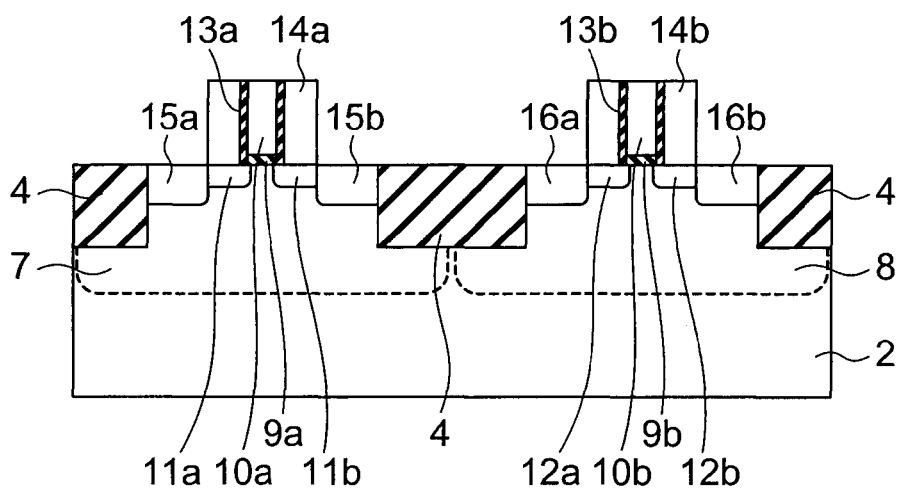

First, the procedures of the first embodiment illustrated in FIGS. 10 to 12 are carried out on a p-type single-crystal silicon semiconductor substrate 42 having a Si(110) plane as the principal surface. The carbon gate sidewalls 14a and 14b in FIG. 12 are selectively removed by exposing to oxygen plasma.

In this embodiment, the channel direction (the direction of the current flow) is aligned in the Si[1-11] direction. It is known that by applying mechanical stress to a channel portion aligned along Si[1-11], the hole mobility in the p-MOSFET can be improved effectively (as disclosed by H. C. H. Wang, et al. in IEDM Tech. Dig. pp. 67-70, 2006, for example).

Figure 21:
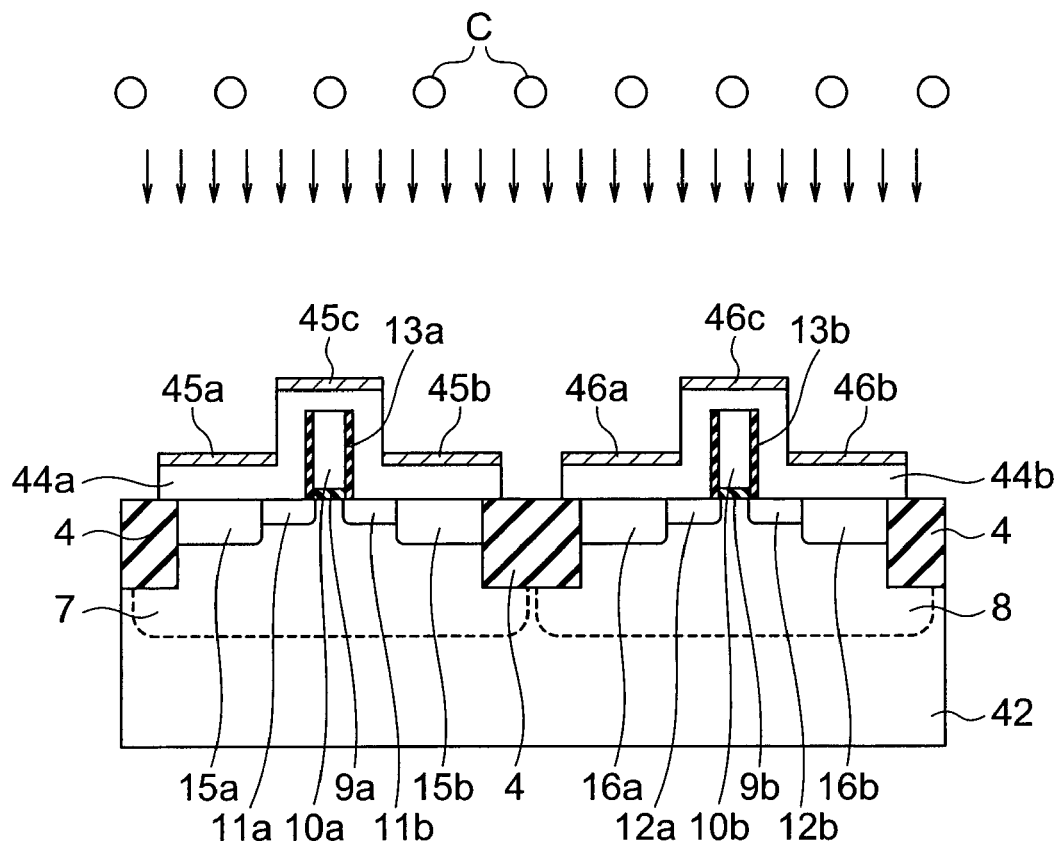
FIGS. 21 to 28 are cross-sectional views showing the procedures for manufacturing a semiconductor device according to a second embodiment.

As shown in FIG. 21, a silicon film is then deposited conformally on the entire surface by an effective conventional technique such as CVD. Removing unnecessary portions using e.g., lithography and RIE leaves silicon films 44a and 44b over the MOSFET structures and also on the device isolating regions 4. The silicon films 44a and 44b remain over the silicon nitride gate sidewalls 13a and 13b and the upper portions of the gate electrodes 10a and 10b. Although the additionally formed silicon film may be amorphous, it can be readily turned into crystals consistent with the lattice structure of the substrate through an appropriate thermal processing. Parts of the silicon films 44a and 44b will serve as source and drain electrodes. Since they can be made to partially extend over the device isolating regions 4, the capacitive coupling with the substrate 42 can be reduced, and a higher-speed device operation can be achieved in this embodiment.

The substrate 42 is then exposed to a carbon-containing plasma. Carbon-containing plasma can be generated by an effective conventional technique. The supply source of carbon may be any source that can provide carbon into plasma. For example, a carbon-containing plasma can be obtained by supplying a gas, such as $CF_4$, $CHF_3$, CCl, or $CH_4$, into plasma. If there is a carbon-containing substance, such as a photoresist, on the substrate, carbon can be released from the carbon-containing substance through ion bombardment in the plasmas.

In general, plasma develops a positive potential with respect to the surroundings, so as to sustain its plasma state. As a result, an electric field is generated in such a direction as to attract positively-charged particles vertically toward the surrounding substances. Accordingly, the positively-charged carbon particles in the plasma impinge vertically on the silicon films 44a and 44b. Of course, the vertically-impinging carbon particles are to be incorporated only into horizontal (i.e., parallel to the substrate) surfaces of the silicon films 44a and 44b. On the other hand, the vertical surfaces of the silicon films remain carbon-free. As a result, carbon-containing silicon layers 45a, 45b, and 45c are formed only on the horizontal portions of the surface of the silicon film 44a, and carbon-containing silicon layers 46a, 46b, and 46c are formed only on the horizontal portions of the surface of the silicon film 44b (see FIG. 21). Since acceleration energy of conventional plasma is less than 1 KV, the thickness of each of the carbon-containing silicon layers 45a, 45b, 45c, 46a, 46b, and 46c is confined within several nanometers. The carbon concentration of 1 atomic % or higher would be enough for the following purpose.

Figure 22:
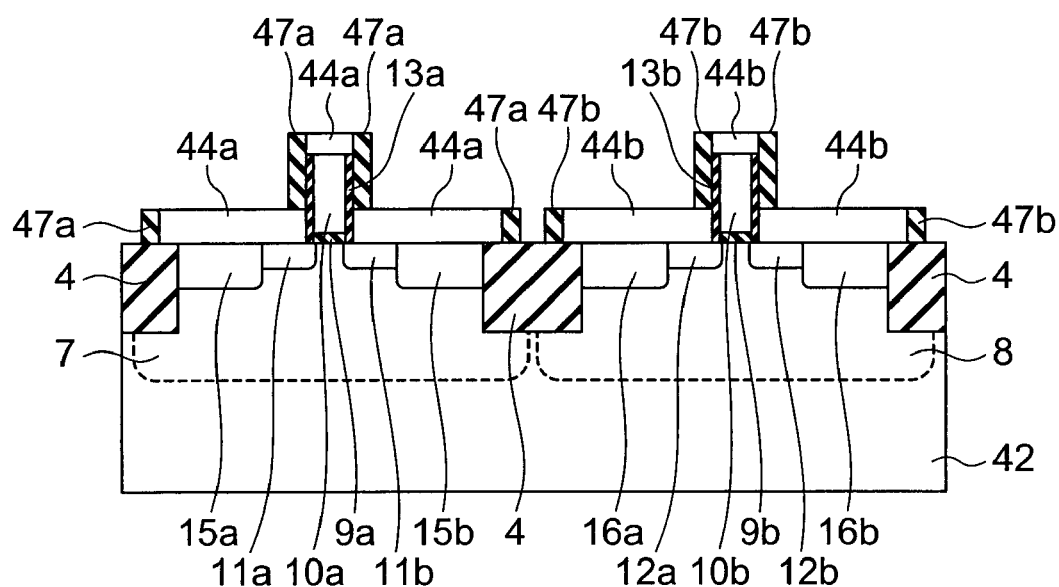

Then, the above structure is thermally oxidized. As disclosed by the inventor in U.S. Pat. No. 6,271,566, the carbon-containing silicon layers 45a, 45b, 45c, 46a, 46b, and 46c are resistant against oxidation. Accordingly, as shown in FIG. 22, only the vertical portions of the silicon films 44a and 44b at the gate sidewall are completely oxidized into silicon oxide films 47a and 47b, whereas un-oxidized portions remains in the horizontal silicon films on the source/drain regions 11a, 11b, 12a, 12b, 15a, 15b, 16a, and 16b, and on also the gate electrodes 10a and 10b. By removing the remaining carbon-containing silicon layers 45a, 45b, 45c, 46a, 46b, and 46c and their oxides using, e.g., RIE, the structure shown in FIG. 22 can be obtained. As stated earlier, through heat stimulus during the thermal oxidation, the silicon films 44a and 44b can be turned into crystals consistent with the substrate 42.

Figure 23:
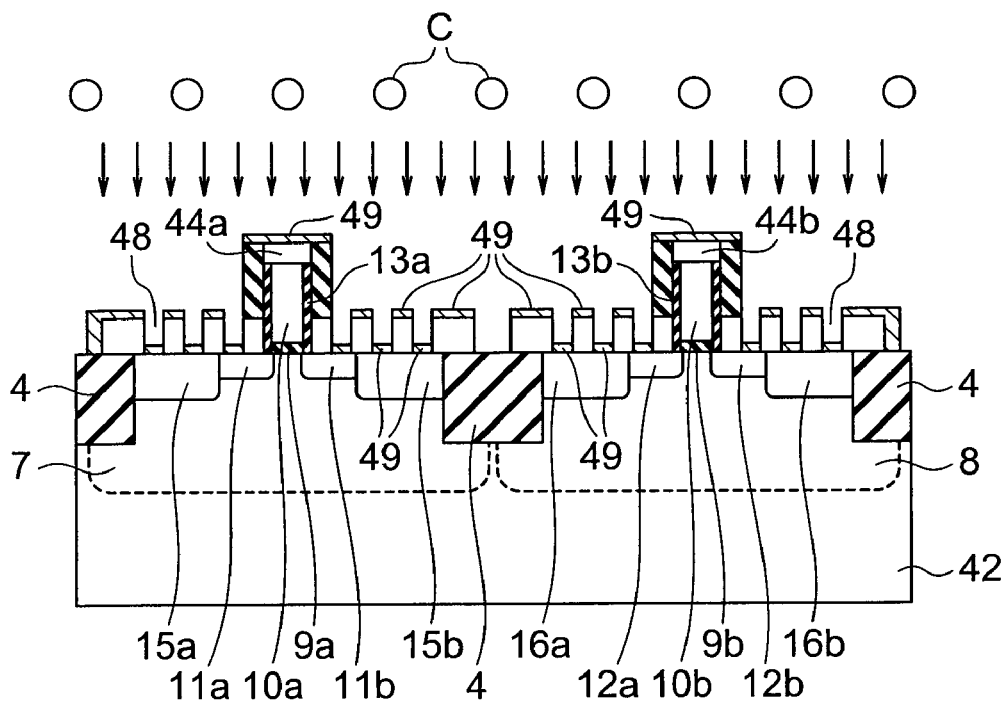

Next, grooves 48 along the gate electrodes 10a and 10b are formed in the silicon films 44a and 44b by lithography and RIE or the likes. It should be noted here that the sidewalls of the grooves 48 are made up of Si{111}. The substrate 42 is exposed again to carbon-containing plasma in the same manner as described above with reference to FIG. 21. As a result, carbon-containing silicon layers 49 are formed exclusively on the horizontal surfaces of the silicon films 44a and 44b as shown in FIG. 23.

Subsequently, atoms, such as Ar, are injected obliquely. The tilted Ar bombardment sputter-etches the carbon-containing silicon layers only on the upper-most horizontal surfaces. Here, the incident direction of the Ar atoms is set to be perpendicular to the channel direction, and the incident angle is adjusted so that the Ar atoms do not reach the bottom portions of the grooves 48. As a result, the carbon-containing silicon layers 49 remain only on the bottom portions of the grooves 48.

Figure 24:
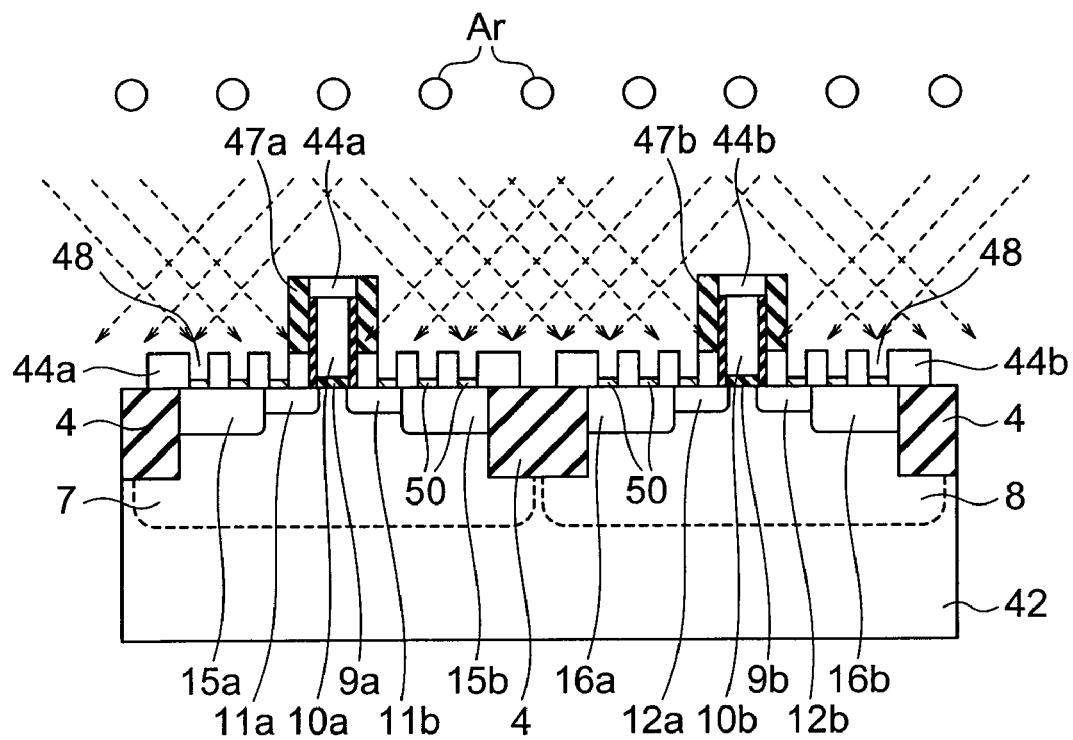

As disclosed in U.S. Pat. No. 6,271,566, when the carbon-containing silicon layers 49 are thermally oxidized, 1- to 2-nm thick carbon-containing silicon oxide layers 50 with excellent resistance against HF wet-etching are formed. Accordingly, by oxidizing the structure and subsequently dipping the resultant structure in a diluted HF solution of 200:1 concentration, the HF-resistant carbon-containing silicon oxide layers 50 remain only on the bottom portions of the grooves 48, as shown in FIG. 24. Here, it should be noted that the carbon-containing silicon oxide layers 50 can be formed selectively, without resorting to a lithography technique.

Next, Ni is deposited over the entire exterior surfaces of the structure by an effective conventional technique such as a sputtering technique, so as to form a Ni layer having a film thickness of 12 nm, for example. If necessary, a capping-layer made of a metal material such as Ti or TiN may be further deposited on the Ni layer. The semiconductor substrate is then subjected to rapid thermal processing in a nitrogen atmosphere at 450° C. for 30 seconds, for example.

Silicidation reaction proceeds exclusively where the Ni and the silicon are in direct contact. Then, the unreacted Ni is selectively wet-etched in a liquid mixture of sulfuric acid and hydrogen peroxide. The Ti or TiN capping-layer is also completely removed by the wet-etching. Therefore, by this self-aligning silicide forming method (SALICIDE method), the TiN layer does not remain at this stage.

Figure 25:
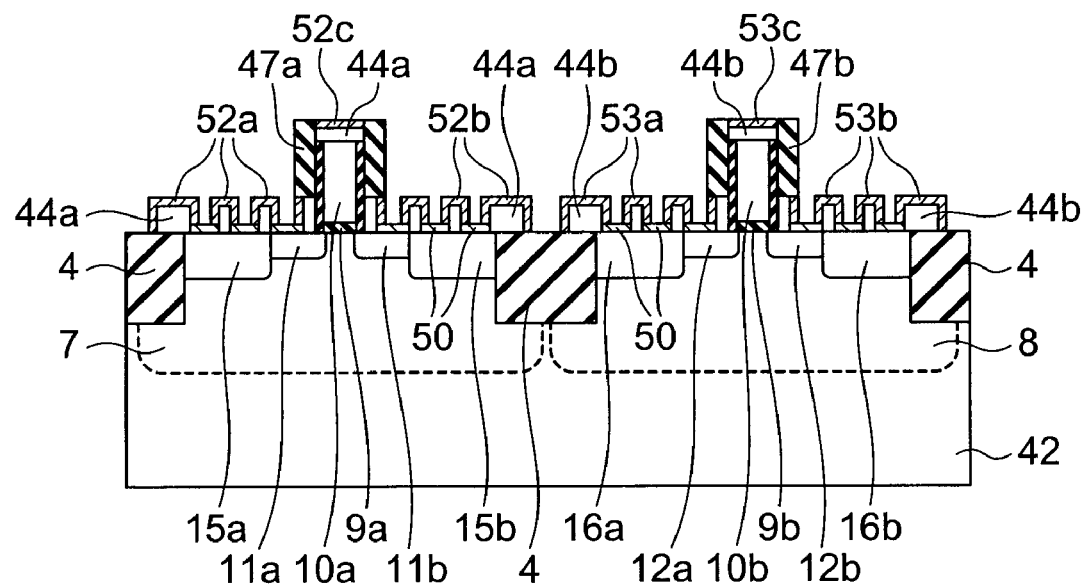

As a result, NiSi layers 52a and 52b are formed on the uppermost horizontal faces and also on the Si{111} sidewalls of the grooves in the single-crystal additional silicon film 44a, and NiSi layer 52c is formed on the portion of the silicon film 44a over the gate electrode 10a, as shown in FIG. 25. Likewise, NiSi layers 53a and 53b are formed on the uppermost horizontal faces and also on the Si{111} sidewalls of the grooves in the single-crystal additional silicon film 44b, and NiSi layer 53c is formed on the portion of the silicon film 44b over the gate electrode 10b. Of course, the NiSi layers 52a, 52b, 53a, and 53b formed on Si{111} are oriented in the NiSi(200) direction.

Here, the width of each of the grooves 48 should be adjusted to a value equivalent to or less than the film thickness of each of the additional silicon films 44a and 44b. With such adjustment, the total area of the interfaces between the NiSi and Si in the source/drain regions becomes larger than the horizontally projected area of the source/drain regions. Therefore, the contact resistance between the NiSi layers and the source/drain regions can be reduced than that of the conventionally silicided MOSFET.

Figure 26:
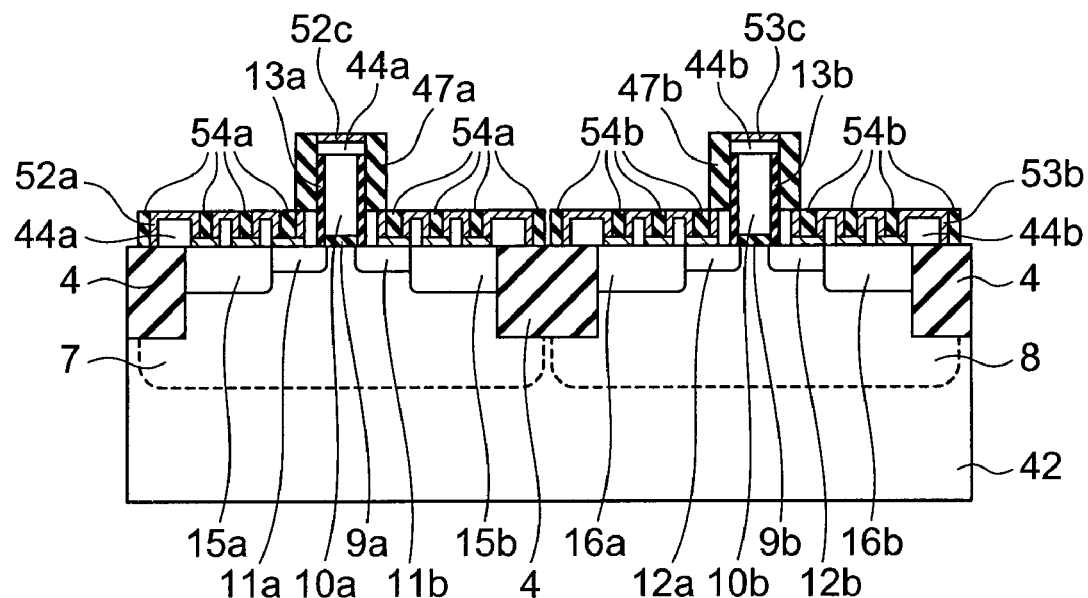

As shown in FIG. 26, a Ti nitride (TiN) film is then deposited over the entire surface by an effective conventional technique such as a sputtering technique or a CVD technique utilizing an organic compound containing Ti and N (TDMA, for example). Ensuing RIE or the like selectively leaves the TiN film in the grooves over the source/drain regions. Of course, TiN sidewalls 54a and 54b are formed over the NiSi layers 52a, 52b, 53a, and 53b on Si{111}. The film thickness of the deposited TiN layer should be adjusted to a value equivalent to or greater than the width of each groove. By doing so, the TiN films 54a and 54b can be left to fill up the grooves after a RIE process. Also, unnecessary portions of the TiN film can be readily removed by making use of wet-etching with a liquid mixture of sulfuric acid and hydrogen peroxide.

Obviously, the NiSi layers formed on Si{111} sidewalls of the grooves in the single-crystal additional silicon layers over the source/drain regions and the extension regions are oriented in the NiSi(200) direction, and thus, free from numerous gap-states formation due to deep ingression of Ni atoms into the Si substrates. Furthermore, since the TiN films are deposited on the NiSi layers, the improved thermodynamic stability of the NiSi layer prevents silicide spike formation around the critical extension regions, even if thermal processing at 500° C. is performed hereafter. This means that junction leakage can be effectively suppressed even though the NiSi layers are formed over the very shallow junctions of the extension regions.

In addition, the metallic materials (i.e., NiSi and TiN) over the extension regions reduce electric resistance of these portions, preventing wasteful electric potential drop, and therefore, allowing sufficient channel current to flow through the extension regions into the NiSi layers. Thus, MOSFETs with high-speed operation can be realized.

Of course, each of the NiSi layers formed on the Si{110} planes is located far above the junction. Accordingly, junction leakage due to infiltration of Ni atoms into the Si substrate is effectively suppressed.

Figure 27:
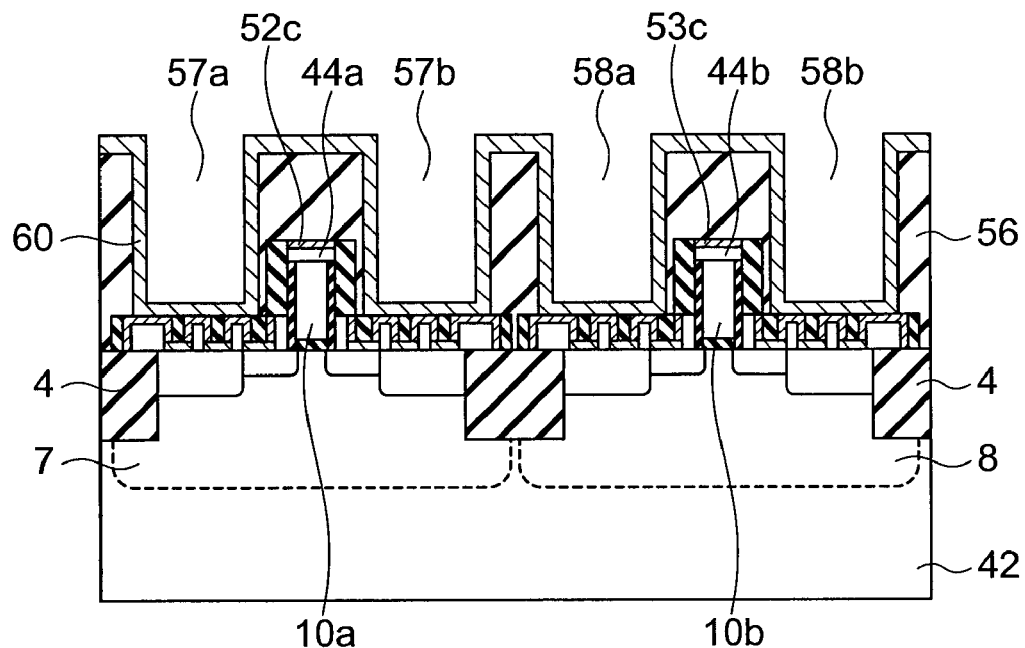

Next, as shown in FIG. 27, an interlayer insulating film 56 is deposited on the entire surface. The interlayer insulating film 56 may be a stack of a thin silicon nitride film and a silicon oxide film, for example. At this stage, the silicon nitride film is better to have internal stress. If the silicon nitride film layer retains compressive stress in the channel direction, the mobility of the holes in the p-MOSFET is greatly improved, and the device operation speed can be increased.

Then, contact holes 57a, 57b, 58a, and 58b are drilled through the interlayer insulating film 56, to expose the NiSi layers, by known techniques such as lithography and RIE. Here, it is preferable to perform the contact-hole RIE in two steps. First etching should be selective removal of the silicon oxide film of the interlayer insulating film 56, using the underling silicon nitride film as an etching-stopper. Subsequent short-time etching of the remaining thin silicon nitride film can avoid excessive plasma damage or the like to the bottom of the contact holes. The quick completion of the second etching also prevents deep encroachment of the contact holes into the isolation insulators even when the bottoms of the contact holes 57a, 57b, 58a, and 58b accidentally fall upon the device isolating regions due to misalignment of the contact-hole patterns. Resulting process tolerance for less accurate alignment of contact-hole patterns to the NiSi layers enables easy contact formation (i.e., "borderless contact formation") and improves manufacturability of the devices. Accordingly the production costs can be reduced.

Naturally, as an etching stopper, the silicon nitride film should be dense, uniform and conformal to the exterior surfaces of very fine structures of advanced semiconductor devices. If the silicon nitride film is porous and of low integrity, it cannot function as a barrier layer or an etching stop layer. If the silicon nitride film is inhomogeneous, it cannot cope with fine structures of advanced semiconductor devices. To obtain a dense and uniform silicon nitride film, the chemical vapor deposition (CVD) with a supply gas containing $Si_2Cl_6$ and $NH_3$ or the atomic layer deposition (ALD) using $SiH_2Cl_4$ and $NH_3$ is preferred to the plasma enhanced CVD (PECVD), though PECVD allows low temperature formation.

In this embodiment, the NiSi layers with the TiN layers stacked thereon in the extension regions have excellent thermal stability. Accordingly, a dense and uniform silicon nitride film can be readily formed using CVD or ALD at a film formation temperature of 500° C. or higher.

Then, as shown in FIG. 27, the NiSi layers at the bottoms of the contact holes are exposed to a plasma containing $NF_3$, to clean the surfaces of the NiSi layers. Then, to prevent harmful impurities and unnecessary materials to reach the sourcedrain regions, a layer of barrier metal, such as a Ti layer 60 having a thickness of e.g., 5 nm, is formed over the entire surface of the semiconductor substrate by a sputtering technique. Subsequently, heat treatment is carried out in a nitrogen atmosphere at 500° C., for example, to establish excellent electric contacts with the NiSi layers. With the help of Ti's strong tendency to chemical reduction, thin oxide films, that inevitably form on air-exposed surfaces of the NiSi layers, can be broken off and removed, resulting in the excellent electrical contacts.

Figure 28:
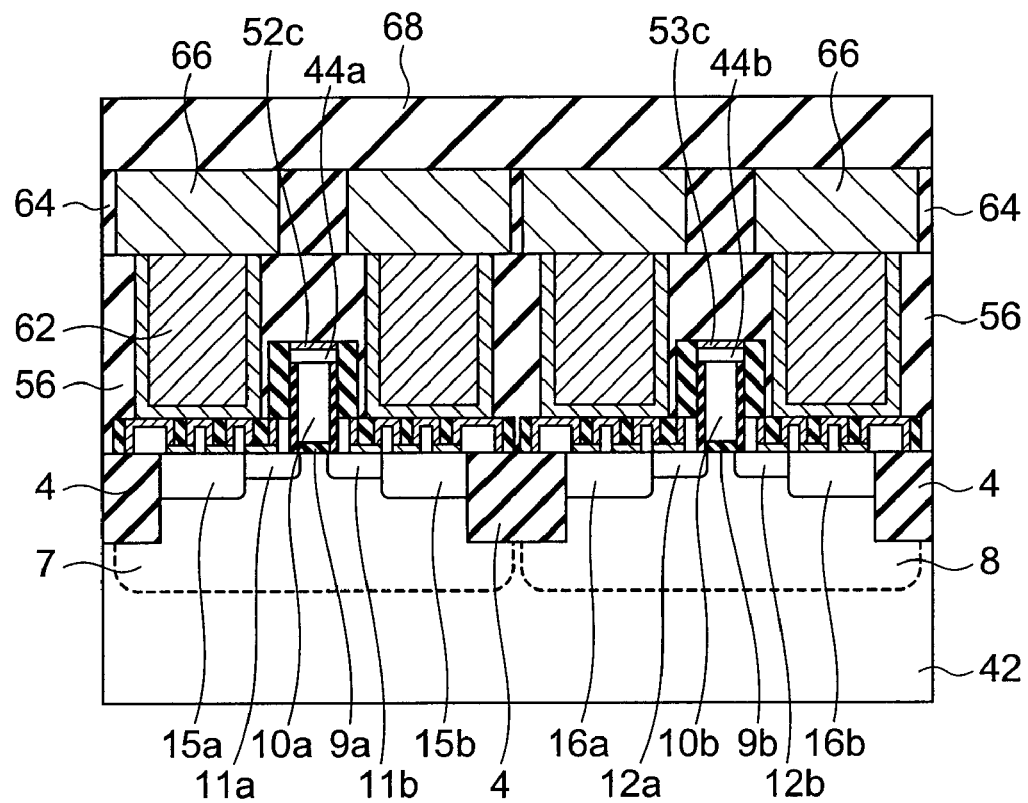

Next, as shown in FIG. 28, the contact holes are filled up with a wiring metal film such as a W film 62, making use of effective known techniques such as CVD and CMP. After that, a silicon oxide film 64 is deposited as an interlayer insulating film. Grooves to accommodate wiring materials are then formed in the silicon oxide film 64 by known techniques such as lithography and RIE. The grooves are then filled with wiring materials such as Cu wires 66 (the damascene method). An insulating film such as a silicon oxide film 68 is then further deposited over the upper portions of the wires 66. If necessary, a multilayer wiring structure may be formed, and dicing, mounting and packaging processes are carried out to complete the semiconductor device.

In this embodiment, the NiSi layers are formed on the Si{111} planes in the regions that have the smallest junction depth in the vicinity of the gate electrodes, and TiN is further deposited on the NiSi layers. Stacking of the TiN layer improves thermodynamic stability of the NiSi layer, thereby, preventing silicide spike formation. Without spikes, leakage generation can be totally suppressed.

Thus, a high-speed C-MOSFET with virtually leakagefree silicided shallow source/drain diffusion layers and excellent electric contacts with wiring metals can be realized.

In this embodiment, the following effects can be achieved:

(a) Since the NiSi layers are formed on Si{111} and oriented in the NiSi(200) direction in the regions having the smallest junction depth, they are free from leakage generation by numerous gap-states formed through deep ingression of Ni atoms into the Si substrates.

(b) Since the TiN layers are stacked on the NiSi layers oriented in the NiSi(200) direction in the regions having the smallest junction depth, the improved thermodynamic stability of the NiSi layer prevents silicide spike formation around this critical regions, even if thermal processing at 500° C. is performed. Thus, the junction leakage can be effectively suppressed even though the NiSi layers are formed over the very shallow junctions of the extension regions.

(c) Since the metallic materials (i.e., NiSi and TiN) over the extension regions reduce electric resistance of these portions, sufficient channel current is allowed to flow through the extension regions into the NiSi layers. Thus, MOSFETs with high-speed operation can be realized.

(d) Thanks to the improved thermal stability attained by the NiSi layers on Si{111} with TiN over-layers, excellent electric connections can be achieved through heat treatment at 500° C. or higher without generating leakage current.

(e) By applying mechanical stress to the channel portion aligned along Si[1-11], the hole mobility in the p-MOSFET can be effectively improved.

(f) As the width of each of the grooves is adjusted to a value equivalent to or less than the film thickness of each of the additional silicon films, the total area of the interfaces between the NiSi layers and the source/drain regions becomes larger than the horizontally projected area of the source/drain regions, thereby, the contact resistance between the NiSi layers and the source/drain regions can be reduced.

(g) By making use of a carbon-containing plasma and oblique ion bombardment, the HF resistant carbon-containing silicon oxide layers can be selectively formed only at the bottom portions of the grooves, without resorting to a lithography technique.

Although a pair of C-MOSFETs have been described in this embodiment, the above described manufacturing method may be implemented in a structure including more than two devices, and may be implemented selectively in a group of devices forming a part of a semiconductor device.

Also, only a part of the upper portion of each gate electrode is silicided in this embodiment. However, this embodiment may be applied to a case where each gate electrode is fully silicided (Fully-Silicided Gate).

Further, the channel direction (the direction of the current flow) is aligned in the Si[1-11] direction in this embodiment. However, it is of course possible to align the channel direction along some other direction. In that case, the direction along which the grooves extend in the single-crystal additional silicon films in the source/drain regions with Si{111} sidewalls may not be parallel to the gate electrode direction, but the effects of the present invention can also be achieved.

(First Modification)

Figure 29:
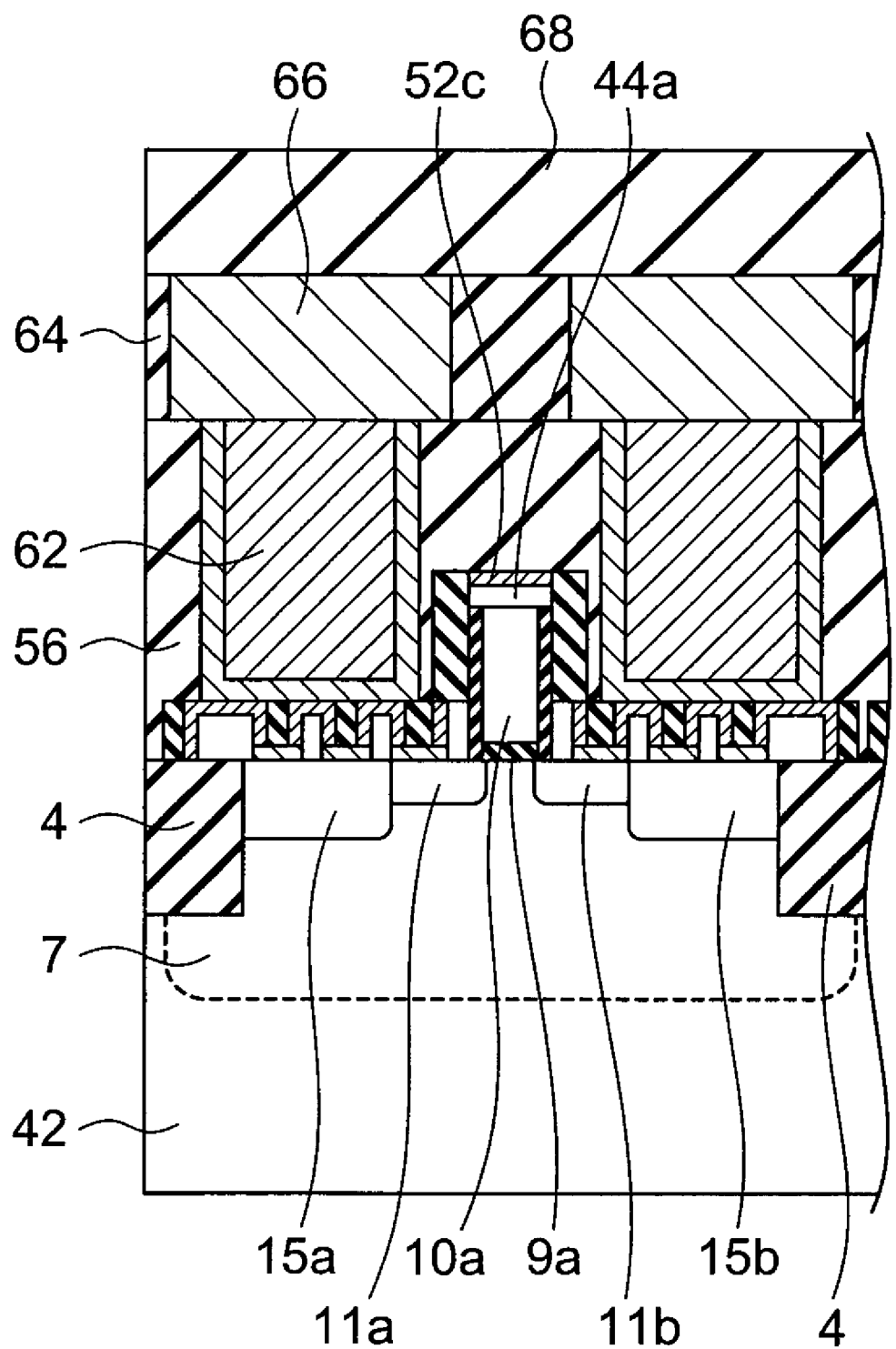
FIG. 29 is a cross-sectional view showing a procedure for manufacturing a semiconductor device according to a first modification of the second embodiment.

FIG. 29 is a cross-sectional view of a semiconductor device in accordance with a first modification of this embodiment. The semiconductor device of this modification includes an n-MOSFET, and this n-MOSFET has the same structure as the n-MOSFET of the C-MOSFET of the second embodiment.

The same effects as those of the second embodiment can be achieved by this modification. Although the semiconductor device of this modification includes an n-MOSFET, the semiconductor device may include a p-MOSFET, instead of the n-MOSFET, and this p-MOSFET may have the same structure as the p-MOSFET of the C-MOSFET of the second embodiment. Such a semiconductor device can also achieve the same effects as those of the second embodiment.

(Second Modification)

Figure 30:
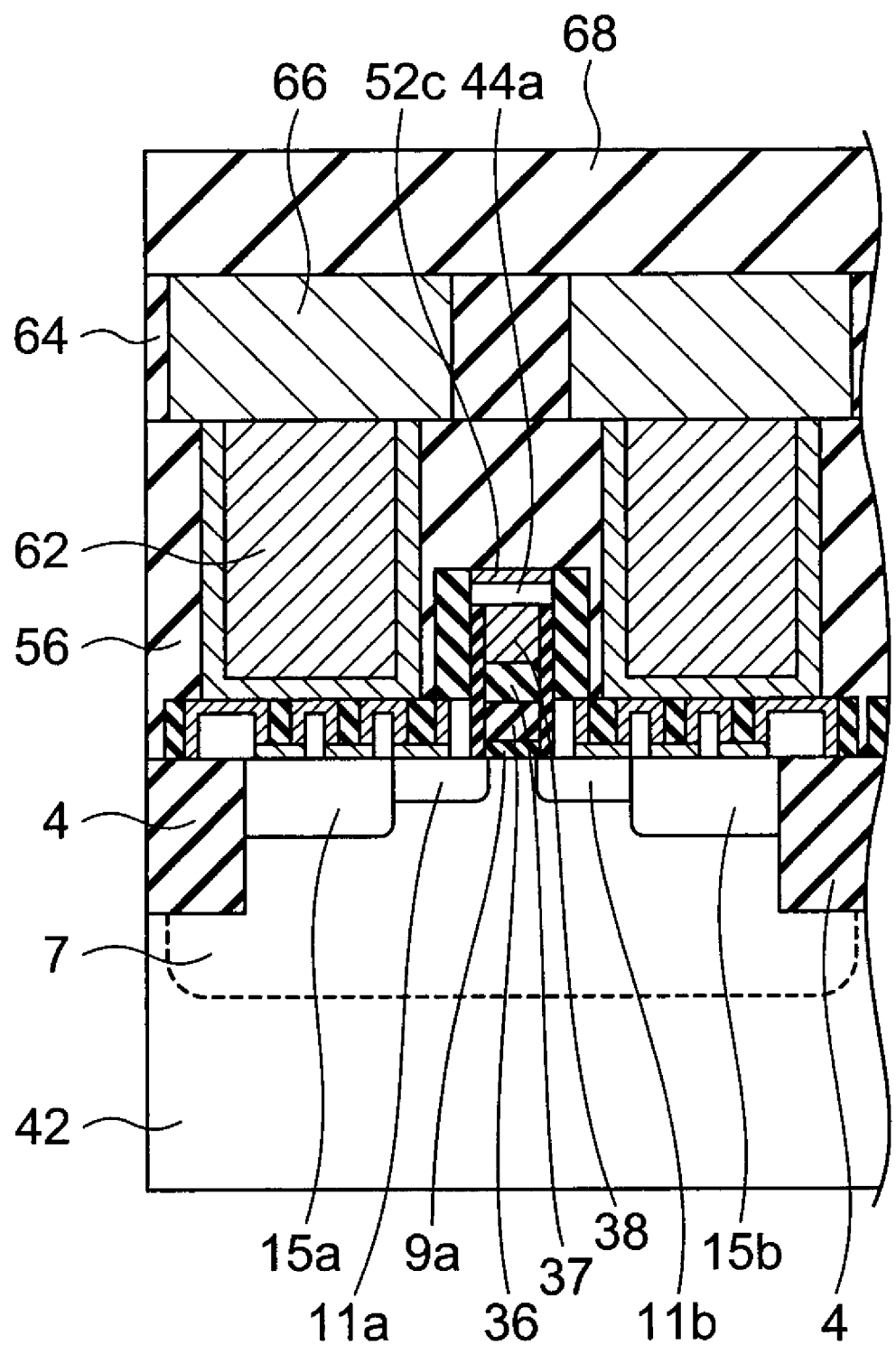
FIG. 30 is a cross-sectional view showing a procedure for manufacturing a semiconductor device in accordance with a second modification of the second embodiment.

FIG. 30 is a cross-sectional view of a semiconductor device in accordance with a second modification of this embodiment. The semiconductor device of this modification is the same as the semiconductor device of the first modification shown FIG. 29, except that the gate has a MONOS structure. More specifically, the gate of the semiconductor device in accordance with this modification has a structure that has a gate insulating film 9a formed on the channel portion of the silicon substrate 2 between the source regions 11a and 15a and the drain regions 11b and 15b, a charge storage film 36 such as a nitride film formed on the gate insulating film 9a, a block insulating film 37 such as an oxide film formed on the charge storage film 36, and a control gate electrode 38 made of a material such as polysilicon formed on the block insulating film 37. It is also possible to form the silicon film 44a and the NiSi layer 52c on the control gate electrode 38 made of polysilicon, as in the first modification. This modification can also achieve the same effects as those of the second embodiment.

Third Embodiment

Next, a semiconductor device in accordance with a third embodiment of the present invention is described. The semiconductor device of this embodiment includes C-MOSFETs each having an elevated source/drain structure on a DSB (Direct Silicon Bonding) substrate. An n-MOSFET is formed on a Si(100) plane of the DSB substrate whereas a p-MOSFET is formed on a Si(110) plane of the DSB substrate. An example of a DSB substrate is disclosed by C. Y. Sung, et al. in IEDM Tech. Dig. pp. 235-238, 2005. By making use of the DSB substrate, the mobility of both MOSFETs of the respective polarities can be maximized. The Si{111} planes are formed in the source/drain regions, NiSi layers are formed on those planes, and TiN films are further stacked on the NiSi layers.

This embodiment realizes a high-speed C-MOSFET structure with virtually leakage-free silicided shallow source/drain diffusion layers and excellent electric contacts with wiring metals through improved thermal stability, and also with optimum carrier mobility of both MOSFETs of the respective polarities.

Referring now to FIGS. 31 to 40B, a method for manufacturing the semiconductor device of this embodiment is described.

Figure 31:
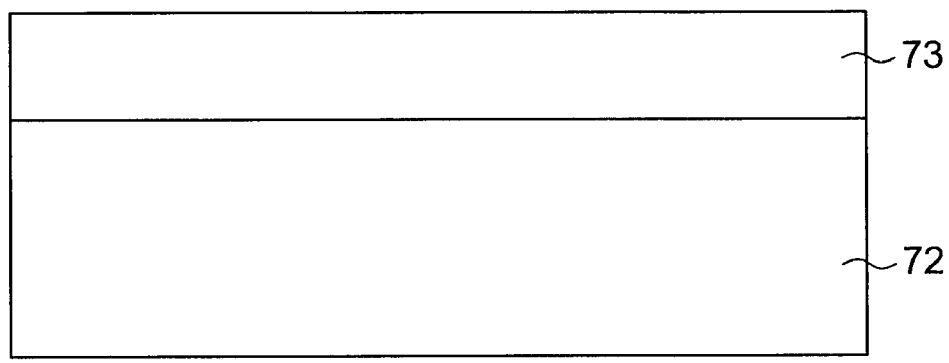
FIGS. 31 to 35 are cross-sectional views showing the procedures for manufacturing a semiconductor device according to a third embodiment.

First, as shown in FIG. 31, a p-type single-crystal silicon semiconductor substrate 73 having a (100) plane as the principal surface is bonded directly onto the principal surface of a p-type single-crystal silicon semiconductor substrate 72 having a (110) plane as the principal surface.

After treating the surfaces of both substrates in, e.g., a diluted HF solution, both surfaces are pressed against each other tightly and annealed in, e.g., an Ar atmosphere. During the annealing, chemical bonds form between dangling Si atoms on the surfaces, and the two substrates can be bonded to each other.

The Si(100) substrate 73 is then thinned down by a conventional technique such as CMP, so as to form a single-crystal silicon semiconductor layer 74.

Figure 32:
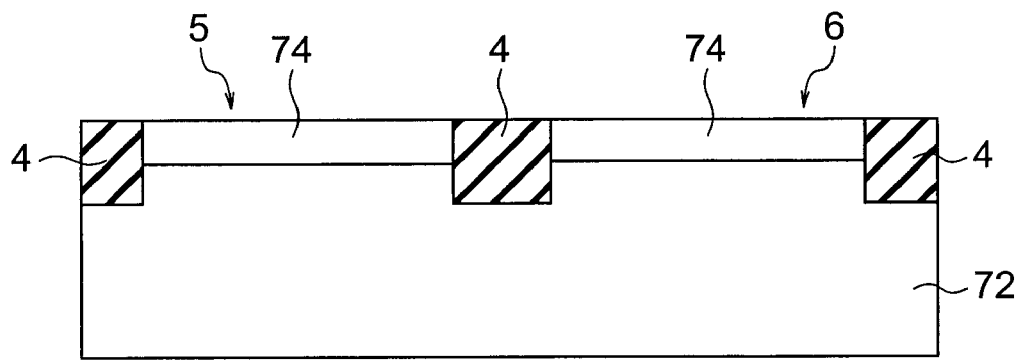

Next, shallow trenches through the silicon semiconductor layer 74 down to the silicon semiconductor substrate 72 are formed. The shallow trenches are then filled with an insulating film such as a silicon oxide film, so as to form device isolating regions 4. These device-isolating regions demarcate a device region 5 for an n-MOSFET and a device region 6 for a p-MOSFET, as shown in FIG. 32.

Figure 33:
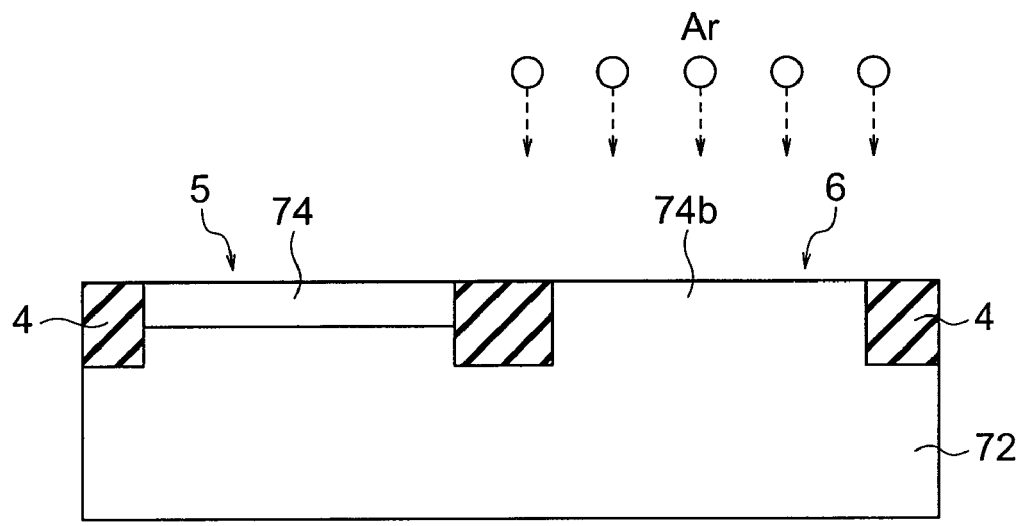

Subsequently, the single-crystal silicon semiconductor layer 74 in the p-MOSFET region 6 is made amorphous by selective ion bombardment into the p-MOSFET formation region with e.g., Ar ions, as shown in FIG. 33. Then, the amorphous layer is recrystallized referring to the lattice structure of the underlying Si(110) substrate through an appropriate thermal processing. As a result, the amorphous semiconductor layer in the p-MOSFET formation region 6 is turned into a crystal consistent with the Si(110) substrate 72. Of course, its surface orientation is converted to Si(110). On the other hand, the surface of the single-crystal silicon semiconductor layer 74 in the n-MOSFET formation region 5 remains to be Si(100). Thus, a DSB substrate is realized.

Figure 34:
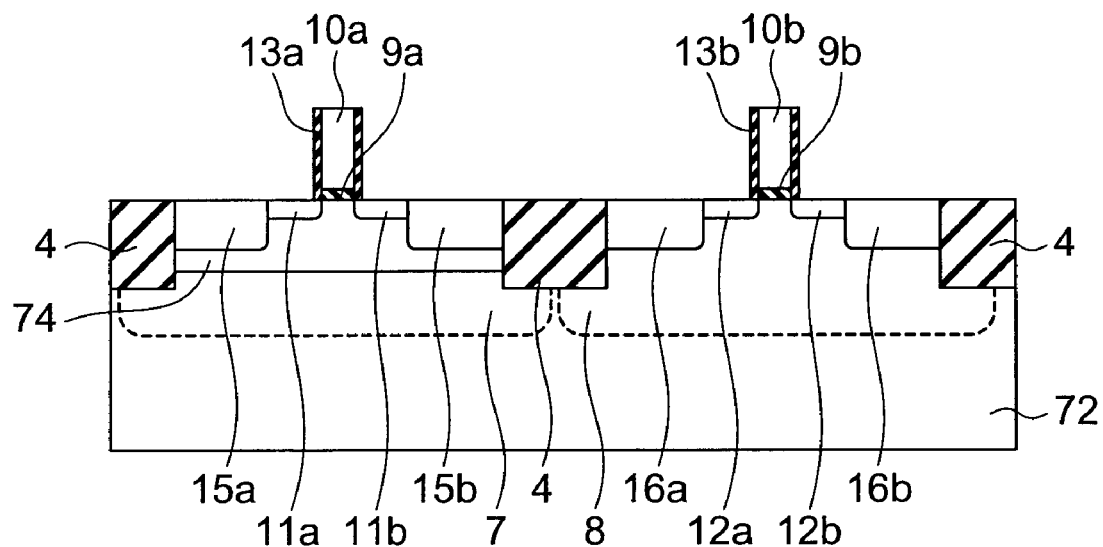

The procedures of the first embodiment illustrated in FIGS. 10 to 12 are then carried out on the DSB substrate, so as to form a p-type well region 7, an n-type well region 8, gate insulating films 9a and 9b, gate electrodes 10a and 10b, SiN gate sidewalls 13a and 13b, carbon gate sidewalls 14a and 14b, shallow diffusion layers of extension regions 11a, 11b, 12a, and 12b, and diffusion layers of source/drain regions 15a, 15b, 16a, and 16b. The carbon gate sidewalls 14a and 14b in FIG. 12 are selectively removed by exposing to oxygen plasma, to realize the structure shown in FIG. 34 is obtained.

Figure 35:
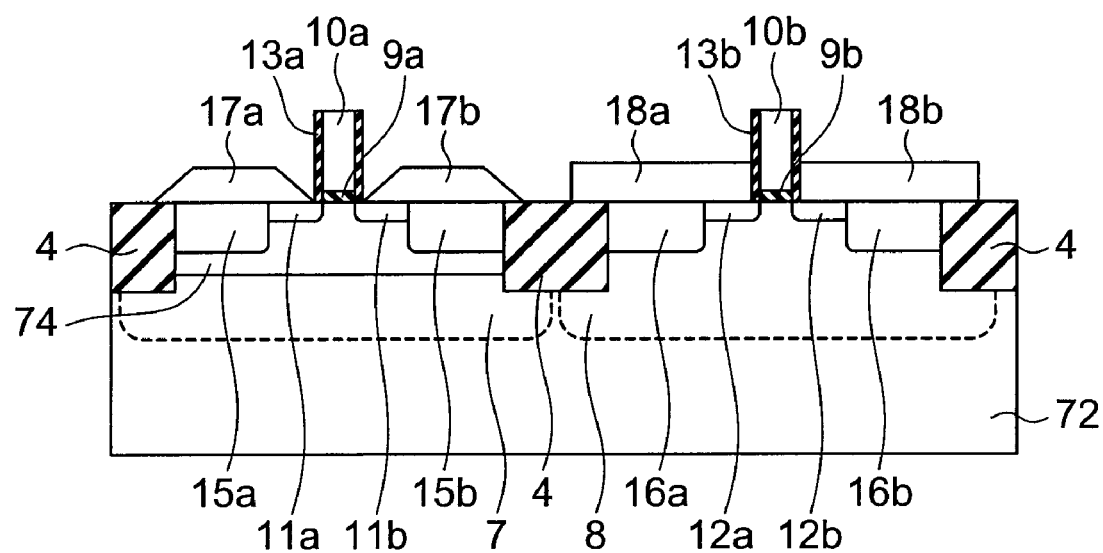

As shown in FIG. 35, additional silicon layers 17a, 17b, 18a, and 18b are then formed over the diffusion layer of the extension regions and the source/drain regions. With the epitaxial growth method, those additional silicon layers 17a, 17b, 18a, and 18b can be obtained, e.g., by providing $SiH_2Cl_2$ at a flow rate of 300 $cm^3$/min, HCl at a flow rate of 200 $cm^3$/min, and $H_2$ at a flow rate of 10000 $cm^3$/min at 10 Torr and 800° C. Each of the additional silicon layers 17a, 17b, 18a, and 18b is designed to have a layer thickness of approximately 50 nm.

Figure 36:
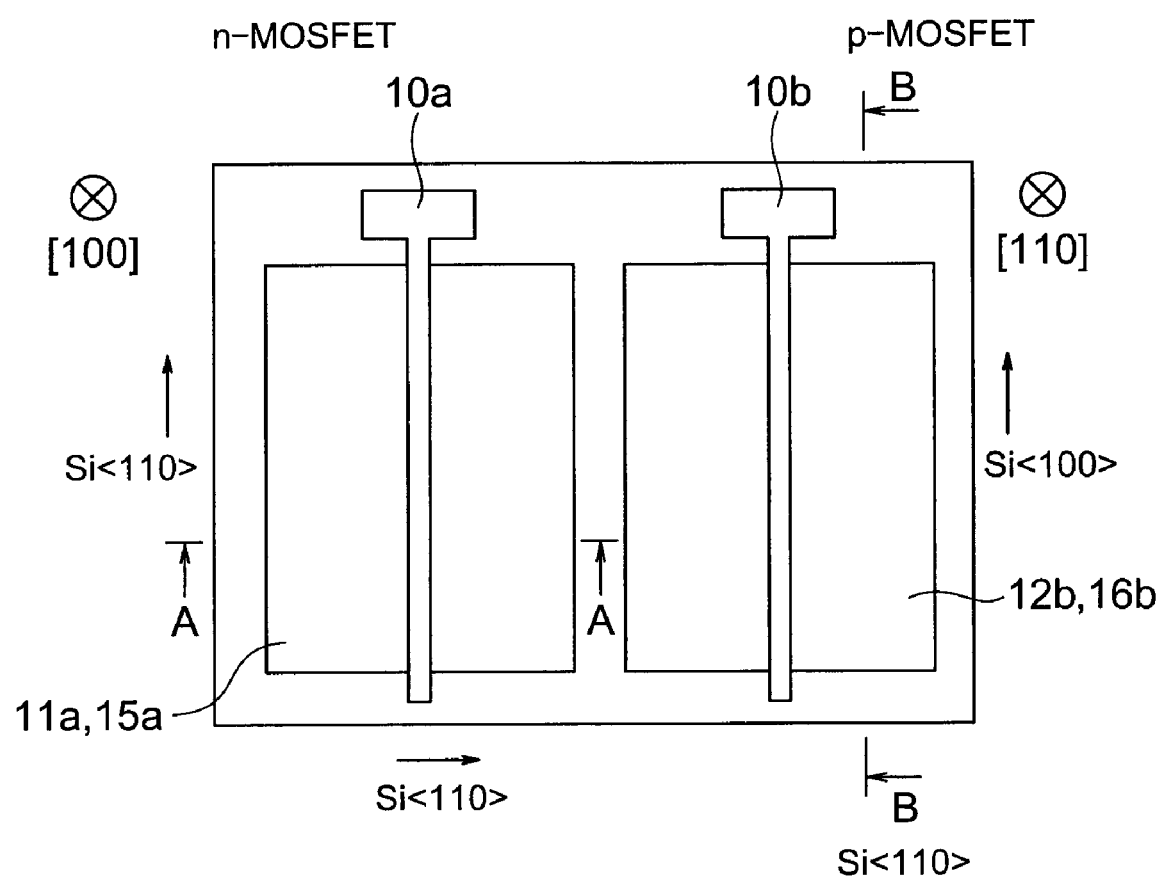
FIG. 36 shows a top view of the semiconductor device at one stage of manufacturing according to the third embodiment.

FIG. 36 shows a top view of the semiconductor device at this stage. In the figure, the crystal orientations are also denoted. As can be seen from FIG. 36, the gate electrode 10a of the n-MOSFET is formed along the Si<110> direction, and the gate electrode 10b of the p-MOSFET is formed along the Si<100> direction. It should be noted that the hole mobility is maximum along Si<110> (as disclosed by H. Irie, et al., in IEDM Tech. Dig. pp. 225-228, 2004, for example).

FIGS. 37A and 37B are cross-sectional views of the semiconductor device, cut along the lines A-A and B-B of FIG. 36. As shown in FIG. 37A, Si{111} facets $19a_1$, $19a_2$, $19b_1$, and $19b_2$ of the additional silicon layers 17a and 17b run along the gate electrode of the n-MOSFET. As shown in FIG. 37B, slanted Si{111} facets $20b_1$ and $20b_2$ of the additional silicon layers 18a and 18b run along the channel direction of the p-MOSFET.

Then, as correspondingly shown in FIGS. 38A and 38B, a silicon oxide film 76 is deposited on the entire surface, and slit-like openings 77 are formed along the channel direction in the silicon oxide film on the p-MOSFET source/drain regions. Slits are not formed on Si{111} facets $20b_1$ and $20b_2$.

The resulting semiconductor substrate is then immersed in a potassium hydroxide (KOH) solution. A KOH solution etches Si, but its etching speed strongly depends on the crystal orientation. The etching along Si<111> is much slower than the etching along the other crystalline orientations. Accordingly, after the etching, a number of V-shaped grooves 79 with slanted Si{111} sidewalls 78 develop along the channel direction at the slits-like openings in the additional silicon layers 18a and 18b. Subsequent wet-etching in HF solution removes the silicon oxide film 76, resulting in the structure illustrated in FIGS. 39A and 39B.

Next, Ni is deposited on the entire surface by an effective conventional technique such as a sputtering technique, so as to form a Ni layer having a film thickness of 12 nm, for example. If necessary, a capping-layer made of a metal material such as Ti or TiN may be further deposited on the Ni layer. The semiconductor substrate is then subjected to rapid thermal processing in a nitrogen atmosphere at 450° C. for 30 seconds, for example. Silicidation reaction proceeds exclusively where the Ni and the silicon are in direct contact. Then, the unreacted Ni is selectively wet-etched in a liquid mixture of sulfuric acid and hydrogen peroxide. The Ti or TiN capping-layer is also completely removed by the wet-etching.

A Ti nitride (TiN) film is further deposited over the entire surface by an effective conventional technique such as a sputtering technique or a CVD technique utilizing an organic compound containing Ti and N (TDMA, for example). Ensuing RIE or the like leaves the portions of the TiN film on the NiSi layers over the Si{111} facets and sidewalls. The RIE process may be shorter than the RIE process in the first embodiment. Of course, unnecessary portions of the TiN film can be readily removed by making use of lithography as well as wet-etching with a liquid mixture of sulfuric acid and hydrogen peroxide.

As a result, NiSi layers 21a and 21b are formed on the additional silicon layers 17a and 17b, a NiSi layer 21c is formed on the gate electrode 10a, a NiSi layer 22b is formed on the additional silicon layer 18b, as shown in FIGS. 40A and 40B. Although not shown in the drawings, NiSi layers are also formed on the additional silicon layer 18a and the gate electrode 10b. In addition, the TiN gate sidewalls 23a and 23b are formed between the NiSi layers on the Si{111} facets and the gate electrode. TiN films 80a, 80b, and 81 are also formed on the NiSi layers on Si{111} facets and sidewalls.

In this structure, the NiSi layers are formed on Si{111} in the portions of the extension regions. Accordingly, the corresponding portions of NiSi are oriented in the NiSi(200) direction, and thus, free from numerous gap-states formation due to deep ingression of Ni atoms into the Si substrates. Furthermore, since the TiN films are deposited on those NiSi portions, the improved thermodynamic stability of the NiSi layer prevents silicide spike formation around the critical regions adjacent to the gate electrodes, even if thermal processing at 500° C. is performed hereafter. This means that junction leakage can be effectively suppressed even though the NiSi layers are formed over the very shallow junctions of the extension regions.

In addition, the metallic materials (i.e., NiSi and TiN) over the extension regions reduce electric resistance of these portions, preventing wasteful electric potential drop, and therefore, allowing sufficient channel current to flow through the extension regions into the NiSi layers. Thus, MOSFETs with high-speed operation can be realized.

Of course, each of the NiSi layers formed on the Si{100} planes is located far above the junction. Accordingly, junction leakage due to infiltration of Ni atoms into the Si substrate is effectively suppressed.

Furthermore, the total area of the interfaces between NiSi and Si in the source/drain regions of the p-MOSFET becomes larger than the horizontally projected area of the source/drain regions. Therefore, the contact resistance between the NiSi layers and the source/drain regions can be reduced than that of the conventionally silicided MOSFET.

For completion of the device, the procedures of the first embodiment illustrated in FIGS. 16 to 18 are carried out to form contact holes reaching the source/drain regions through an interlayer insulating film. Each of the contact holes is filled up with an electric wiring substance, and metal wires are formed. If necessary, a multilayer wiring structure may be formed, and dicing, mounting and packaging processes are carried out to complete the semiconductor device.

In this embodiment, the n-MOSFET channel is formed on the Si(100) plane whereas the p-MOSFET channel is formed on the Si(110) plane. With this arrangement, the mobility of both MOSFETs of the respective polarities can be maximized. Of course, the NiSi layers are formed on the Si{111} planes at least around the regions of the smallest junction depth. TiN is further deposited on the NiSi layers. Stacking of the TiN layer improves thermodynamic stability of the NiSi layer, thereby, preventing silicide spike formation. Without spikes, leakage generation can be totally suppressed.

Thus, a high-speed C-MOSFET with virtually leakage-free silicided shallow source/drain diffusion layers, excellent electric contacts with wiring metals and with optimum carrier mobility of both MOSFETs of the respective polarities can be realized.

Although a pair of C-MOSFETs have been described in this embodiment, the above described manufacturing method may of course be implemented in a structure including more than two devices, and may be implemented selectively in a group of devices forming a part of a semiconductor device.

Further, the channel direction is aligned along Si<110> in this embodiment. However, it is of course possible to align the channel direction along some other direction. In that case, the direction along which the Si{111}-bounded V-shaped grooves are formed may not be perpendicular to the gate electrode, but the effects of this embodiment can also be achieved.

Also, only a part of the upper portion of each gate electrode is silicided in this embodiment. However, this embodiment may be applied to a case where each gate electrode is fully silicided (Fully-Silicided Gate).

Fourth Embodiment

Next, a semiconductor device in accordance with a fourth embodiment of the present invention is described. The semiconductor device of this embodiment is a Fin-MOSFET structure formed on a SOI substrate. In this structure, Si{111} planes are formed in the source/drain regions, and NiSi layers are formed on the Si{111} of the source/drain regions. TiN films are further stacked on the NiSi layers.

With this arrangement, leakage generation by numerous gap-states due to ingression of Ni atoms into the channel region can be avoided. Thus, an increase in OFF current can be prevented. Also, improved thermodynamic stability of the NiSi layer prevents silicide spike formation, even if thermal processing at 500° C. is performed. Thus, excellent electric contact with the wiring metal can be secured.

An example of a Fin-MOSFET structure is disclosed by X. Huang, et al, in IEEE ED vol. 48, p. 880 (2001), for example.

Referring now to FIGS. 41 to 47(*c*), a method for manufacturing the semiconductor device of this embodiment is described.

Figure 41:
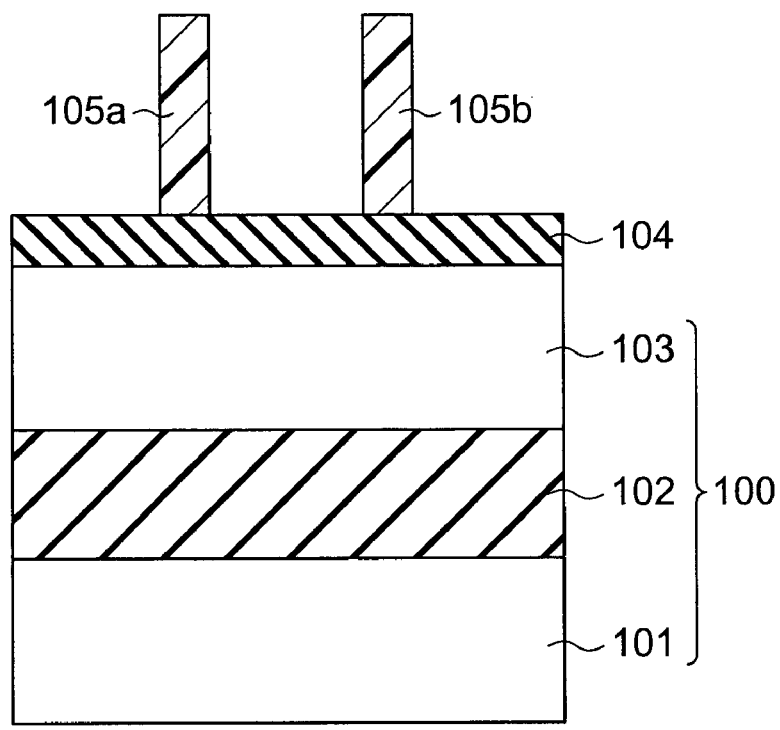
FIGS. 41 to 44 are cross-sectional views showing a procedure for manufacturing the semiconductor device according to a fourth embodiment.

First, as shown in FIG. 41, a silicon nitride film 104, for example, is formed by an effective conventional technique, such as CVD, on a SOI substrate 100, that is composed of a lower silicon substrate 101, a silicon oxide film 102 thereon, and a single-crystal silicon layer (SOI layer) 103 having a Si{110} plane as the upper surface. Then, by an effective conventional technique such as a lithography technique, photoresist masks 105*a* and 105*b* are formed on the silicon nitride film 104.

Figure 42:
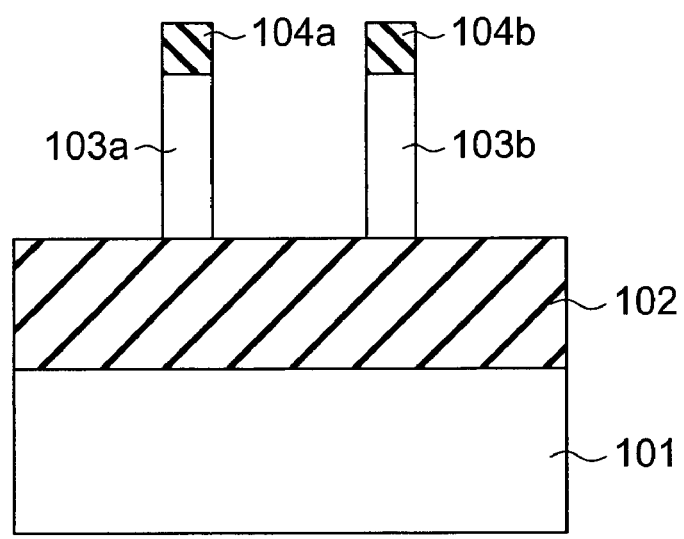

With the use of the photoresist masks 105*a* and 105*b*, the SOI layer 103 is patterned into a shape shown in FIG. 42 by RIE or the like. After removing the photoresist masks, silicon layers 103*a* and 103*b* with thin wall-like plate-shapes (i.e., fin-shapes) having practically vertical Si{111} sidewalls are formed. At this stage, patterned silicon nitride films 104*a* and 104*b* remain on the silicon layers 103*a* and 103*b*. It should be understood that FIG. 42 is a cross-sectional view of the fin-structure, cut along the thickness direction of the fins.

Figure 43:
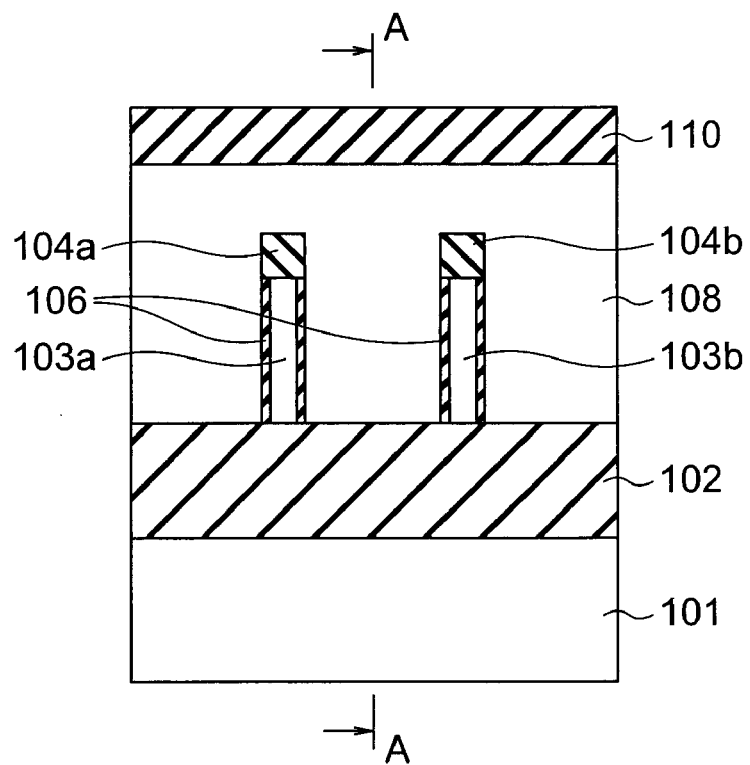

As shown in FIG. 43, thermal oxide films 106 of e.g., 2 nm in film thickness are then formed as gate insulating films over the fin sidewalls of the silicon layers 103*a* and 103*b*. Subsequently, a polysilicon film 108 is deposited over the entire surface by e.g., CVD and then planarized by e.g., CMP. A silicon nitride film 110 is further deposited over the polysilicon film 108 by CVD or the like, and planarized by CMP or the like.

Next, by an effective conventional technique such as a lithography technique, an etching mask (not shown) is formed on the silicon nitride film 110. The etching mask is formed along the direction perpendicular to the thickness direction of the fin-shaped walls 103*a* and 103*b* (i.e., a direction within the cross-sectional plane in FIG. 43). Since the polysilicon film 108 and the silicon nitride film 110 are made flat, the lithography for the etching mask is relatively easy.

Then, by making use of the etching mask, the silicon nitride film 110 and the polysilicon film 108 are etched anisotropically with an effective conventional technique such as RIE. After removal of the etching mask, polysilicon gate electrodes 108 are formed so as to straddle over the fin-shaped silicon layers 103*a* and 103*b*. Prior to the formation of the gate electrodes, conductive impurities may of course be introduced into the portions of the polysilicon film 108 by effective known techniques such as a lithography technique and an ion implantation technique.

Figure 44:
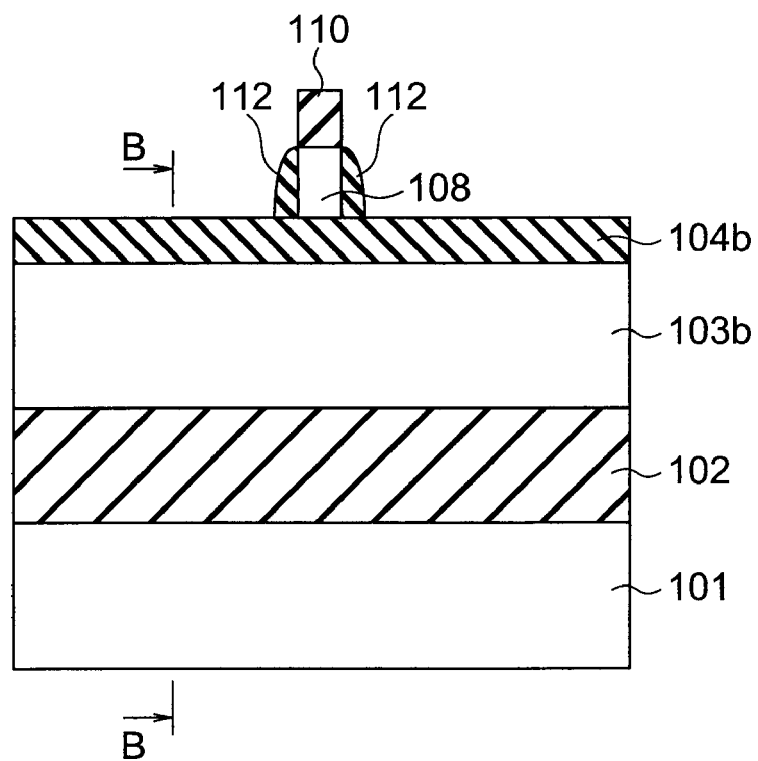

A silicon nitride film is then deposited by an effective conventional technique such as CVD, and etched anisotropically by an effective conventional technique such as RIE, so as to leave the silicon nitride sidewalls 112 at the both sides of the gate electrodes 108 as shown in FIG. 44. FIG. 44 is a cross-sectional view of the structure cut along the line A-A of FIG. 43.

The anisotropic etching should be performed thoroughly, so that the silicon nitride film 112 does not remain at the sides of the fin-shaped silicon layers 103*a* and 103*b*.

Figure 45:
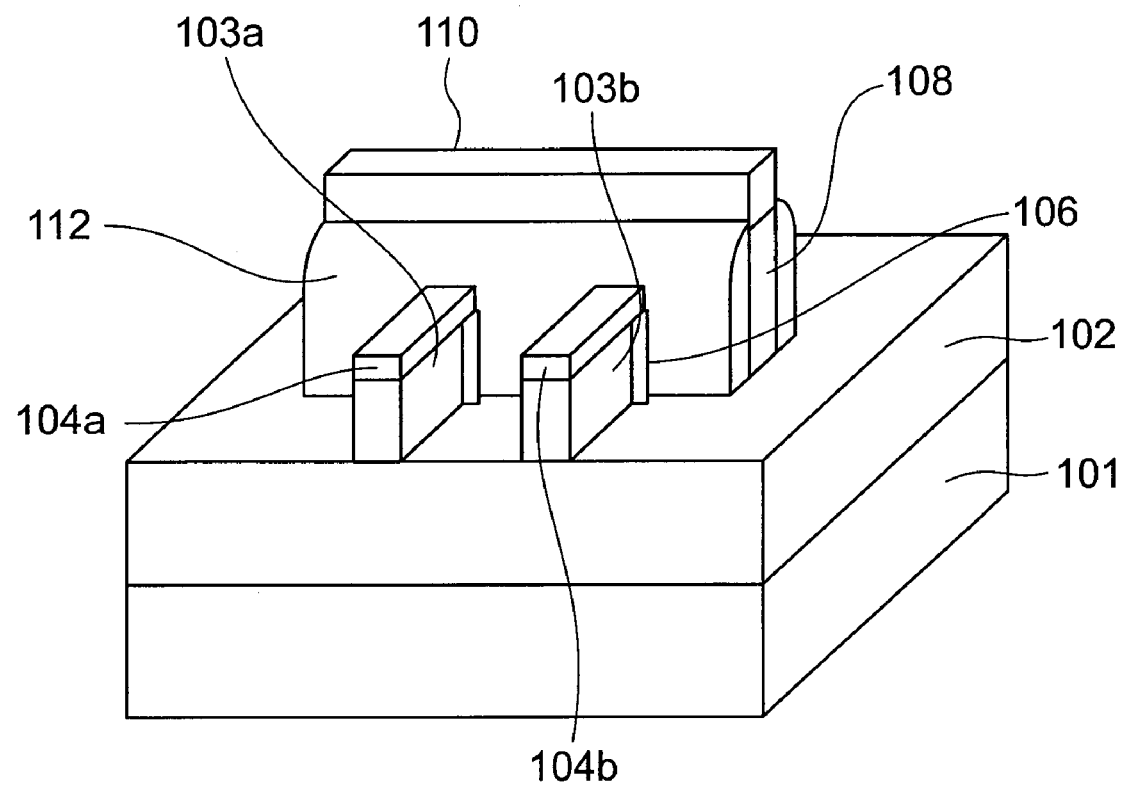
FIG. 45 is a bird's-eye perspective view of the semiconductor device at one stage of manufacturing according to the fourth embodiment.

The exposed gate insulating films 106 on the both sides of the fin-shaped silicon layers 103*a* and 103*b* are removed with a HF solution or the like as shown in FIG. 45. FIG. 45 is a bird's-eye perspective view of the structure obtained at this stage.

Next, using the gate electrodes as masks, conductive impurity such as n-type impurity As ions are injected sideways into the exposed source/drain regions of the fin-shaped silicon layers 103*a* and 103*b*. The impurity is then diffused uniformly along the thickness direction of the source/drain regions of the fins, and electrically activated.

Then, Ni film 114 is deposited on the entire surface by an effective conventional technique such as sputtering, so as to form a Ni layer having a film thickness of 12 nm, for example. If necessary, a capping-layer made of a metal material such as Ti or TiN may be further deposited on the Ni layer. The semiconductor substrate is then subjected to rapid thermal processing in a nitrogen atmosphere at 450° C. for 30 seconds, for example. Silicidation reaction proceeds exclusively in the exposed source/drain regions of the Fin-shaped silicon layers 103*a* and 103*b*. Then, the unreacted Ni is selectively wet-etched in a liquid mixture of sulfuric acid and hydrogen peroxide. At this stage, it should be noted that, the Ti or TiN capping-layer is also completely removed by the wet-etching. As a result, NiSi layers 114*a* and 114*b* are formed on both Si{111} sidewalls of the source/drain regions.

Figure 46:
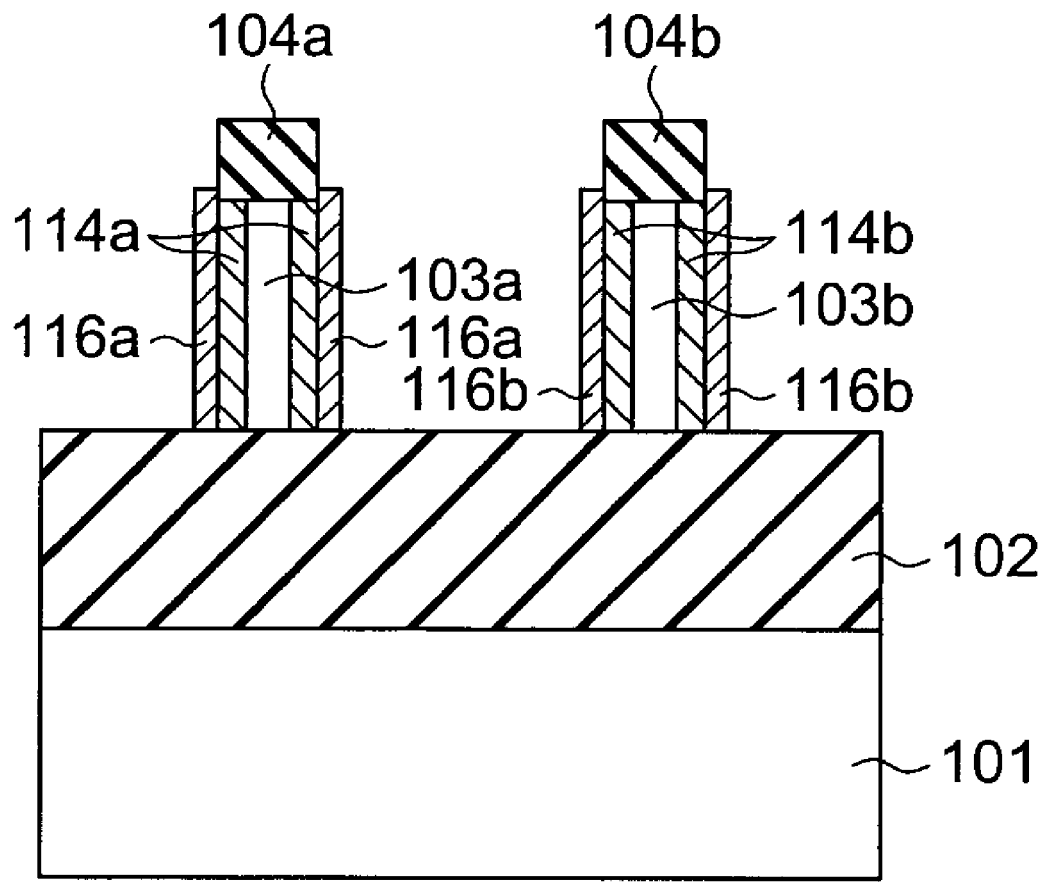
FIG. 46 is a cross-sectional view showing a procedure for manufacturing the semiconductor device according to the fourth embodiment.

A Ti nitride (TiN) film is then deposited over the entire surface by an effective conventional technique such as a sputtering technique or a CVD technique utilizing an organic compound containing Ti and N (TDMA, for example). Ensuing RIE or the like leaves the TiN sidewalls over the NiSi layers 114*a* and 114*b* on both Si{111} sidewalls of the source/drain regions of the fin-shaped silicon layers 103*a* and 103*b*, as shown in FIG. 46. Of course, unnecessary portions of the TiN film can be readily removed by making use of lithography as well as wet-etching. FIG. 46 is a cross-sectional view of the Fin-structure, cut along the thickness direction of the fins (or along the line B-B of FIG. 44).

In this structure, the NiSi layers are formed on both Si{111} sidewalls of the source/drain regions. Accordingly, the corresponding portions of NiSi are oriented in the NiSi (200) direction, and thus, free from numerous gap-states formation due to ingression of Ni atoms into the fin-shaped silicon layers 103*a* and 103*b*. Therefore, an increase in OFF current can be avoided.

Also, since the silicides are formed on both sidewalls of the source/drain regions, the interfacial area between the NiSi layers and the source/drain regions per unit channel width (in the present case, the channel width being the fin height) becomes twice as large as the corresponding value in a conventional MOSFET. Therefore, the contact resistance between the NiSi layers and the source/drain regions can be reduced.

Moreover, the TiN sidewalls stacked over the NiSi layers on Si{111} sidewalls of the source/drain regions improves thermodynamic stability of the NiSi layer. Therefore, even if thermal processing over 500° C. is performed later, agglomeration of the NiSi layers and silicide spike formation can be prevented. Absence of the agglomeration ensures that the very thin fin-shaped silicon layers remain intact after a thermal treatment. Thermal integrity of the NiSi layers deters detrimental total consumption of the thin fin-shaped silicon layers by NiSi, due to agglomeration-induced localized thickening of the NiSi layer. Since the channel current can flow smoothly in and out of the entire source/drain regions without encountering such pinching points by thickening silicide layers, the entire interface between Si and NiSi can function as a proper contact and the contact resistance can be kept at a low value. In addition, the absence of the agglomeration prevents an increase in sheet resistance of the NiSi layers, which is otherwise inevitable due to thermal deformation of the NiSi layers into disconnected islands.

Furthermore, in the fin-FET structure, the thin channel silicon layers are sandwiched by the gate electrodes via the gate insulating films, so as to form a so-called double-gate MOSFET structure. With this arrangement, interfaces at both sides of the fin-shaped silicon layers function as channels. In addition, by quantum interference between left and right inversion layers, the degeneracy in electron states of the Si conduction band can be readily removed, so that only high-speed electrons are induced in the channels. Because the channel mobility increases, the driving force of the MOSFET is expected to increase accordingly (i.e., double or more, as disclosed by M. Shoji, et al. in J. Appl. Phys. P. 2722 (1999), for example).

For completion of the device, the procedures of the first embodiment illustrated in FIGS. 16 to 18 are carried out to form contact holes reaching the source/drain regions through an interlayer insulating film. Each of the contact holes is filled with an electric wiring substance, and metal wires are formed. If necessary, a multilayer wiring structure may be formed, and dicing, mounting and packaging processes are carried out to complete the semiconductor device.

In the present embodiment, Si{111} planes are formed in the source/drain regions, and NiSi layers are formed on the Si{111} in the source/drain regions. TiN films are further stacked on the NiSi layers. With this arrangement, leakage generation by numerous gap-states due to ingression of Ni atoms into the channel region can be avoided. Thus, an increase in OFF current can be prevented. Also, improved thermodynamic stability of the NiSi layer prevents agglomeration and silicide spike formation, even if thermal processing at 500° C. is performed. Thus, excellent electric contact with the wiring metal can be secured.

Although polysilicon is used for the gate electrodes in this embodiment, it is of course possible to use some other metal material. Also, the portions of the nitride film located on the gate electrodes made of polysilicon may be removed, and the upper portions of the polysilicon gate electrodes or the entire polysilicon gate electrodes may be silicided. Further, the gate siliciding process may be carried out separately from the process of siliciding the source/drain electrodes, or may be carried out at the same time as the process of siliciding the source/drain electrodes.

Prior to the silicidation of the source/drain regions of this embodiment, additional silicon layers may be selectively grown on the source/drain electrodes, so as to increase the thickness of the source/drain electrodes.

Although one MOSFET is formed with two Fin silicon layers in this embodiment, it is of course possible to form one MOSFET with one Fin. It is also possible to form a MOSFET structure having more than two Fins. Although the manufacture of an n-MOSFET of one polarity has been described in this embodiment, it is of course possible to form a p-MOSFET in the same manner as described above, and it is apparent that the above described method may be used in the manufacture of a C-MOSFET semiconductor device.

Figure 47:
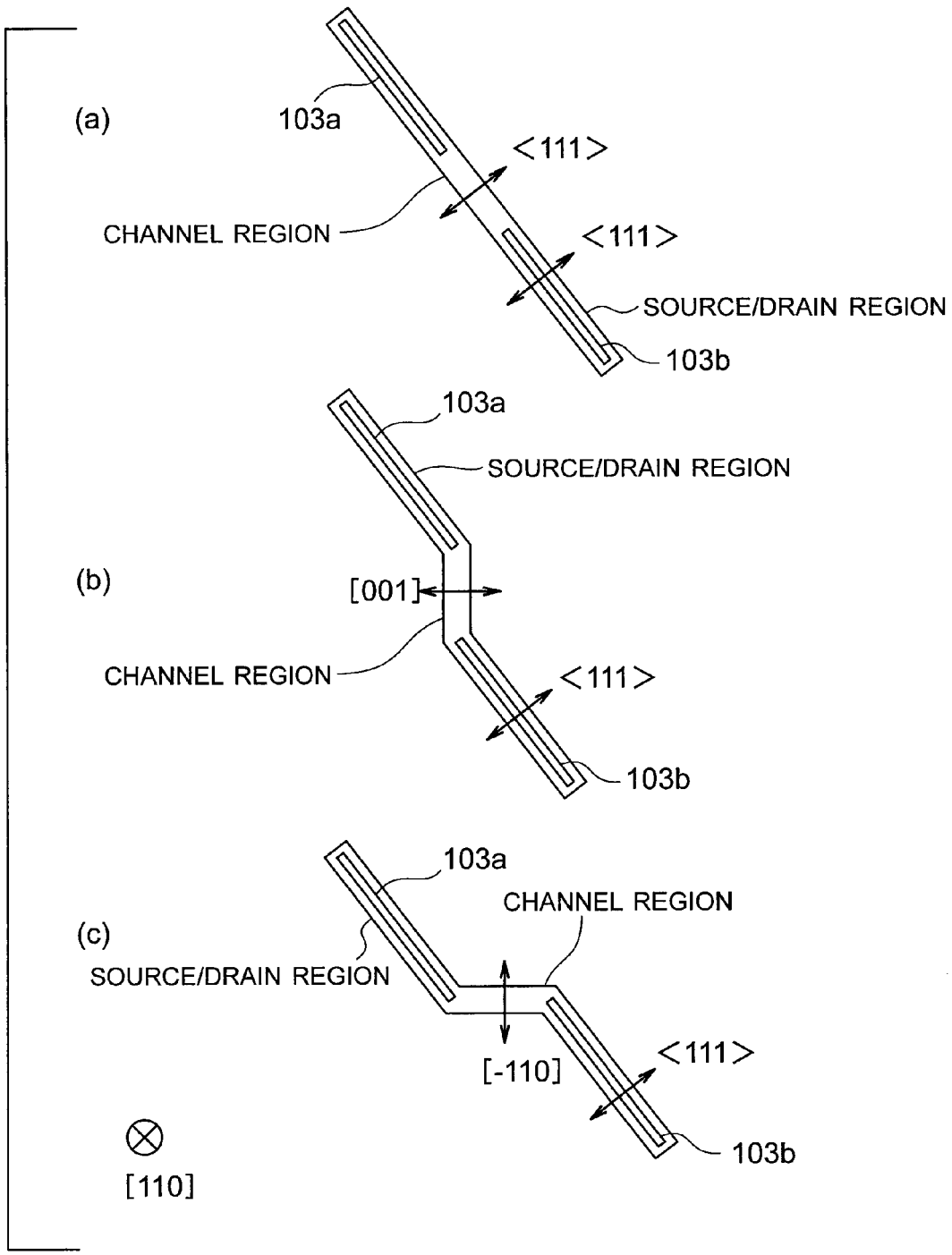
FIGS. 47(a) to 47(c) are top views of Fin structures of semiconductor devices according to the fourth embodiment.

Although each fin has a linearly straight shape in this embodiment, it is possible to employ any of the shapes illustrated in FIGS. 47(*a*), 47(*b*), and 47(*c*). A Si(110) substrate has Si{100}, Si{110} and Si{111} as vertical planes. Therefore, while keeping the normal directions of the sidewalls of the source/drain regions to Si<111>, the normal direction of the channel plane can be Si<111> as shown in FIG. 47(*a*), Si<100> as shown in FIG. 47(*b*), or Si<110> as shown in FIG. 47(*c*). FIGS. 47(*a*), 47(*b*), and 47(*c*) are top views of Fin structures.

Also, the silicidation of the source/drain electrodes of the present invention may be applied not only to fin structures but also to conventional SOI-MOSFETs that do not have Fin structures.

As described so far through the above embodiments, the present invention has the following advantages:

(1) Since the NiSi layers are formed on Si{111} and oriented in the NiSi(200) direction at least in the regions having the smallest junction depth, they are free from leakage generation by numerous gap-states formed through deep ingression of Ni atoms into the Si substrates.

(2) Since the TiN layers are stacked on the NiSi layers oriented in the NiSi(200) direction in the regions having the smallest junction depth, the improved thermodynamic stability of the NiSi layer prevents silicide spike formation around the critical regions adjacent to the gate electrodes, even if thermal processing at 500° C. is performed. Thus, the junction leakage can be effectively suppressed even though the NiSi layers are formed over the very shallow junctions of the extension regions.

(3) Since the metallic materials (i.e., NiSi and TiN) over the extension regions reduce electric resistance of these portions, sufficient channel current is allowed to flow through the extension regions into the NiSi layers. Thus, MOSFETs with high-speed operation can be realized.

(4) Thanks to the improved thermal stability attained by the NiSi layers on Si{111} with TiN over-layers, excellent electric connections can be achieved through sufficient heat treatment at 500° C. or higher without generating leakage current.

(5) Thanks to the improved thermal stability attained by the NiSi layers on Si{111} with TiN over-layers, a dense and uniform silicon nitride film that is suitable for a barrier layer or an etching stopper layer can be readily formed.

Further, in a case where additional silicon layers are selectively formed on the source/drain regions including the extension regions of the substrate having the Si{100} plane as the principal surface as in the first embodiment, the following advantages are achieved:

(6) When additional silicon layers are selectively formed on the source/drain regions including the extension regions, Si{111} facet planes can be automatically formed in the regions adjacent to the gate electrode where the junction depth is smallest.

(7) Since the additional silicon layers forming parts of the source/drain electrodes are made to partially extend over the device isolating regions, the capacitive coupling with the substrate can be reduced, and a higher-speed device operation can be achieved.

Also, in a case where additional silicon layers are selectively formed on the source/drain regions including the extension regions of the substrate having the Si{110} plane as the principal surface, and grooves having Si{111} sidewalls are formed as in the second embodiment, the following advantages are achieved:

(8) By making use of a carbon-containing plasma and oblique ion bombardment, the HF resistant carbon-containing silicon oxide layers can be selectively formed only at the bottom portions of the grooves, without resorting to a lithography technique.

(9) As the width of each of the grooves is adjusted to a value equivalent to or less than the film thickness of each of the additional silicon films, the total area of the interfaces between NiSi and Si in the source/drain regions becomes larger than the horizontally projected area of the source/drain regions, thereby, the contact resistance between the NiSi layers and the source/drain regions can be reduced.

(10) By applying mechanical stress to the channel portion aligned along Si[1-11], the hole mobility in the p-MOSFET can be improved effectively.

Furthermore, as in the third embodiment, an n-MOSFET is formed on the Si(100) plane in a DSB substrate, and a p-MOSFET is formed on the Si(110) plane in the DSB substrate. With this structure, the mobility of both MOSFETs of the respective polarities can be maximized. At the same time,

(11) By making use of crystal-orientation-dependent Si etching in a potassium hydroxide (KOH) solution, V-shaped grooves with slanted Si{111} sidewalls are readily formed in the additional silicon layers over the source/drain regions including the extension regions. Accordingly, the total area of the interfaces between the NiSi layers and the source/drain regions becomes larger than the horizontally projected area of the source/drain regions, thereby, the contact resistance between the NiSi layers and the source/drain regions can be reduced.

Further, as in the fourth embodiment of the present invention, when Fin-FETs, with thin wall-like plate-shape silicon layers (i.e., fins) on a SOI substrate and gate electrodes straddling over them, are formed, the source/drain regions can be made to have Si{111} sidewalls, and NiSi layers can be formed on the Si{111}. TiN films can be further stacked on the NiSi layers. With this arrangement, the following advantages can be obtained:

(12) The NiSi layers are formed on both Si{111} sidewalls of the source/drain regions. Accordingly, the corresponding portions of NiSi are oriented in the NiSi(200) direction, and thus, free from numerous gap-states formation due to ingression of Ni atoms into the fin-shaped silicon layers. Therefore, an increase in OFF current can be avoided.

(13) The TiN sidewalls over the NiSi layers on Si{111} sidewalls of the source/drain regions improves thermodynamic stability of the NiSi layer. Therefore, even if thermal processing over 500° C. is performed later, agglomeration of the NiSi layers and silicide spike formation can be prevented. Absence of the agglomeration ensures nonexistence of accidental total consumption of the silicon layers due to agglomeration-induced localized thickening of the NiSi layer. Without such pinching points by thickening silicide layers, the entire interface between NiSi and Si can function as a proper contact and the contact resistance can be kept at a low value.

(14) The absence of the agglomeration also prevents an increase in sheet resistance of the NiSi layers, which is otherwise inevitable due to thermal deformation of the NiSi layers into disconnected islands.

(15) Since the silicides are formed on both sidewalls of the source/drain regions, the interfacial area between the NiSi layers and the source/drain regions per unit channel width becomes twice as large as the corresponding value in a conventional MOSFET. Therefore, the contact resistance between the NiSi layers and the source/drain regions can be reduced.

(16) Both interfaces on the left and right sides of the fin-shaped silicon layers function as channels. Also, by quantum interference between left and right inversion layers, the degeneracy in electron states of the Si conduction band can be readily removed, so that only high-speed electrons are induced in the channels. Accordingly, the channel mobility and the driving force of the MOSFET increase significantly.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
a silicon substrate including a first semiconductor region of a first conductivity type; and
a first MOSFET comprising:
first source and drain regions of a second conductivity type formed at a distance from each other in the first semiconductor region;
a first insulating film formed on a portion of the first semiconductor region, the portion being located between the first source region and the first drain region;
a first gate electrode formed on the first insulating film;
a first sidewall insulating film formed at side portions of the first gate electrode;
a first single-crystal silicon layer formed on each of the first source and drain regions, and having at least an upper-face made of a {111} plane;
a first NiSi layer formed at least on the first single-crystal silicon layer, and having a portion whose interface with the first single-crystal silicon layer is on the {111} plane of the first single-crystal silicon layer and a part of the portion of the first NiSi layer being in contact with the first sidewall insulating film; and
a first TiN film being in contact with the portion of the first NiSi layer on the {111} plane of the first single-crystal silicon layer.

2. The device according to claim 1, wherein:
the first single-crystal silicon layer has a facet made of a {111} plane in contact with the first sidewall insulating film;
the first NiSi layer is formed at least on the facet of the first single-crystal silicon layer; and
the first TiN film is disposed between the first NiSi layer on the facet of the first single-crystal silicon layer and the first sidewall insulating film.

3. The device according to claim 1, wherein the first semiconductor region has a surface that is a {100} plane of silicon.

4. The device according to claim 1, wherein:
the first NiSi layer formed on the {111} plane of the first single-crystal silicon layer is made of a single crystal or poly-crystals; and
the NiSi{100} plane of each crystal grain of the first NiSi layer formed on the {111} plane of the first single-crystal silicon layer is parallel to the {111} plane of the first single-crystal silicon layer.

5. The device according to claim 1, further comprising a device isolating region surrounding the first semiconductor region,
wherein the first single-crystal silicon layer extends over the device isolating region.

6. The device according to claim 1, wherein the first source and drain regions each include a first diffusion layer that is formed adjacent to the gate electrode, and a second diffusion layer that is formed at a longer distance from the gate electrode than the first diffusion layer and has a greater junction depth than the first diffusion layer.

7. The device according to claim 1, wherein the first gate electrode includes a charge storage film that is formed on the first insulating film, a block insulating film that is formed on the charge storage film, and a control gate electrode that is formed on the block insulating film.

8. The device according to claim 1, wherein:
the silicon substrate further includes a second semiconductor region of the second conductivity type being device-isolated from the first semiconductor region; and
the device further includes a second MOSFET formed in the second semiconductor region, and the second MOSFET comprising:
second source and drain regions of the first conductivity type formed at a distance from each other in the second semiconductor region;
a second insulating film formed on a portion of the second semiconductor region, the portion being located between the second source region and the second drain region;
a second gate electrode formed on the second insulating film;
a second sidewall insulating film formed at side portions of the second gate electrode;
a second single-crystal silicon layer formed on each of the second source and drain regions, and having at least an upper-face made of a {111} plane;
a second NiSi layer formed at least on the {111} plane of the second single-crystal silicon layer, and having a portion whose interface with the second single-crystal silicon layer is on the {111} plane of the second single-crystal silicon layer and a part of the portion of the second NiSi layer being in contact with the second sidewall insulating film; and
a second TiN film being in contact with the portion of the second NiSi layer on the {111} plane of the second single-crystal silicon layer.

9. The device according to claim 8, wherein:
the second NiSi layer formed on the {111} plane of the second single-crystal silicon layer is made of a single crystal or poly-crystals; and
the NiSi{100} plane of each crystal grain of the second NiSi layer formed on the {111} plane of the second single-crystal silicon layer is parallel to the {111} plane of the second single-crystal silicon layer.

10. A semiconductor device comprising:
a silicon substrate including a first semiconductor region of a first conductivity type; and
a first MOSFET comprising:
first source and drain regions of a second conductivity type formed at a distance from each other in the first semiconductor region;
a first insulating film formed on a portion of the first semiconductor region, the portion being located between the first source region and the first drain region;
a first gate electrode formed on the first insulating film;
a first sidewall insulating film formed at side portions of the first gate electrode;
a first single-crystal silicon layer formed on each of the first source and drain regions;
a first NiSi layer formed on the first single-crystal silicon layer, an interface between the first single-crystal silicon layer and the first NiSi layer being on {111} planes of the first single-crystal silicon layer; and
a first TiN film being in contact with the first NiSi layer.

11. The device according to claim 10, wherein:
the first MOSFET is a p-MOSFET;
the first semiconductor region has a surface that is a {110} plane of silicon;
the silicon substrate further includes a p-type second semiconductor region being device-isolated from the first semiconductor region and having a surface that is a {100} plane of silicon; and
the device further includes an n-MOSFET formed in the second semiconductor region, the n-MOSFET comprising:
n-type second source and drain regions formed at a distance from each other in the second semiconductor region;
a second insulating film formed on a portion of the second semiconductor region, the portion being located between the second source region and the second drain region;
a second gate electrode formed on the second insulating film;
a second sidewall insulating film formed at side portions of the second gate electrode;
a second single-crystal silicon layer formed on each of the second source and drain regions, and having at least an upper-face made of a {111} plane;
a second NiSi layer formed at least on the second single-crystal silicon layer, and having a portion whose interface with the second single-crystal silicon layer is on the {111} plane of the second single-crystal silicon layer and a part of the portion of the second NiSi layer being in contact with the second sidewall insulating film; and
a second TiN film being in contact with the portion of the second NiSi layer on the {111} plane of the second single-crystal silicon layer.

12. The device according to claim 10, wherein:
the first NiSi layer formed on the {111} plane or planes of the first single-crystal silicon layer is made of a single crystal or poly-crystals; and
the NiSi{100} plane of each crystal grain of the first NiSi layer formed on the {111} plane of the first single-crystal silicon layer is parallel to the underlying Si{111} plane of the first single-crystal silicon layer.

\* \* \* \* \*